US008617798B2

(12) United States Patent
Mason et al.

(10) Patent No.: US 8,617,798 B2
(45) Date of Patent: Dec. 31, 2013

(54) CUSTOMIZED LITHOGRAPHIC PARTICLES

(75) Inventors: Thomas G. Mason, Los Angeles, CA (US); Carlos J. Hernandez, San Leandro, CA (US)

(73) Assignee: The Regents of the University of California, Oakland, CA (US)

( * ) Notice: Subject to any disclaimer, the term of this patent is extended or adjusted under 35 U.S.C. 154(b) by 1052 days.

(21) Appl. No.: 12/377,773

(22) PCT Filed: Aug. 17, 2007

(86) PCT No.: PCT/US2007/018365
§ 371 (c)(1),
(2), (4) Date: Feb. 17, 2009

(87) PCT Pub. No.: WO2008/021540
PCT Pub. Date: Feb. 21, 2008

(65) Prior Publication Data
US 2010/0035061 A1   Feb. 11, 2010

Related U.S. Application Data

(60) Provisional application No. 60/838,160, filed on Aug. 17, 2006.

(51) Int. Cl.
*G03F 7/20* (2006.01)

(52) U.S. Cl.
USPC ........... 430/320; 460/323; 460/324; 460/325; 460/329

(58) Field of Classification Search
None
See application file for complete search history.

(56) References Cited

U.S. PATENT DOCUMENTS

| 6,107,102 | A  | * | 8/2000 | Ferrari ........................ 436/518 |
| 6,268,222 | B1 |   | 7/2001 | Chandler et al. |
| 6,835,424 | B2 |   | 12/2004 | Larson, Jr. et al. |
| 7,056,840 | B2 |   | 6/2006 | Miller et al. |

(Continued)

FOREIGN PATENT DOCUMENTS

WO    WO 2005/007282 A2  *  1/2005

OTHER PUBLICATIONS

Kay, P.H. et al., "The Production of Precision Silicon Micromachined Mon-Spherical Particles for Aerosol Studies", Journal of Aerosol Studies vol. 23, Supplement 1, pp. 201-204 (1992).*

(Continued)

*Primary Examiner* — John A. McPherson
(74) *Attorney, Agent, or Firm* — Venable LLP; Henry J. Daley

(57) ABSTRACT

A method of producing particles includes providing a substrate structure that comprises a solid substrate; forming a target structure on said substrate structure, said target structure comprising a radiation-reactive material; forming a spatially patterned beam of radiation using a patterned mask; exposing at least a portion of the target structure to the spatially patterned beam of radiation to which the radiation-reactive material reacts while leaving other portions of the target structure unexposed to the radiation; removing substantially all of one of the exposed or the unexposed patterned portions of the target structure to provide a plurality of non-contiguous structures that include at least a portion of the radiation-reactive material; and separating the plurality of non-contiguous structures comprising the radiation-reactive material from the substrate structure into a fluid material. Each non-contiguous structure of the radiation-reactive material provides at least a portion of a separate particle after the separation.

33 Claims, 19 Drawing Sheets

(56) References Cited

U.S. PATENT DOCUMENTS

| | | | |
|---|---|---|---|
| 2002/0022124 A1* | 2/2002 | Ruoff | 428/325 |
| 2004/0175843 A1* | 9/2004 | Roitman et al. | 436/531 |
| 2006/0138602 A1 | 6/2006 | Mulkens et al. | |

OTHER PUBLICATIONS

Adams, M. et al., "Entropically driven microphase transitions in mixtures of colloidal rods and spheres". *Nature*, vol. 393, pp. 349-352 (1998).

Antl, L. et al. "The preparation of poly(methyl methacrylate) latices in non-aqueous media", *Colloid Surf.*, vol. 17, pp. 67-78 (1986).

Ashkin, A. et al., "Oberservation of a single-beam gradient force optical trap for dielectric particles". *Opt. Lett.*, vol. 11, pp. 288-290 (1986).

Brown, A. B. D. et al., "Fabricating colloidal particles with photolithography and their interactions at an air-water interface", *Phys. Rev. E*, vol. 62, pp. 951-960 (2000).

Casagrande, C. et al., "Janus beads: Realization and behavior at water/oil interfaces." *Europhys. Lett.*, vol. 9, pp. 251-255 (1989).

Cheng, Z. et al., "Light streak tracking of optically trapped thin microdisks". *Phys. Rev. Lett.*, vol. 89, pp. 108303/1-4 (2002).

Chou, S. Y. "Nanoimprint lithography and lithographically induced self-assembly", *MRS Bulletin*, vol. 26, pp. 512 (2001).

Chou, S. Y. et al., "Nanoimprint lithography". *J. Vacuum Sci. Tech. B*, vol. 14, pp. 4129-4133 (1996).

Dendukuri, D. et al., "Continuous-flow lithography for high-throughput microparticle synthesis". *Nature Mater.*, vol. 5, pp. 365-369 (2006).

Dinsmore, A. D. et al. "Colloidosomes: Selectively permeable capsules composed of colloidal particles". *Science*, vol. 298, pp. 1006-1009 (2002).

Donev, A. et al. "Improving the density of jammed disordered packings using ellipsoids". *Science*, vol. 303, pp. 990-993 (2003).

Frenkel, D. "Plenty of room at the top", *Nature Mater.*, vol. 5, pp. 85-86 (2006).

Galajda, Peter et al., "Complex micromachines produced and driven by light", Applied Physics Letter, vol. 78, No. 2, pp. 249-251; Jan. 2006.

Gasser, U. et al., "Real-space imaging of nucleation and growth in colloidal crystallization". *Science*, vol. 292, pp. 258-262 (2001).

Hernandez, Carlos Javier, "Novel Lithographic techniques for the Production of Monodisperse colloids: LithoParticles", University of California, May 2007.

Hernandez, Carlos, et al., "Colloidal Alophabet Soup: Monodisperse dispersions of Shape-Designed LithoParticles", The Journal of Physical Chemistry, pp. 4477-4480; Feb. 13, 2007.

Higurashi, E. et al., "Optically induced angular alignment of birefringent micro-objects by linear polarization". *Appl. Phys. Lett.*, vol. 73, pp. 3034-3036 (1998).

Jin, R. et al. "Photoinduced conversion of silver nanospheres to nanoprisms", *Science*, vol. 294, pp. 1901-1903 (2001).

Kato, Jun-Ichi et al., "Multiple-spot parallel processing for laser micronanofabrication", Applies Physics Letter, vol. 86, pp. 044102, Jan. 2005.

Korda, P. et al. "Nanofabrication with holographic laser tweezers", *Rev. Sci. Instr.*, vol. 73, pp. 1956-1957 (2002).

Leunissen, M. E. et al. "Ionic colloidal crystals of oppositely charged particles". *Nature*, vol. 438, pp. 235-239 (2005).

Lin, Y. S. et al., "Well-ordered mesoporous silica nanoparticles as cell markers", *Chem. Mater.*, vol. 17, pp. 4570-4573 (2005).

Liu, A. J. et al. "Jamming is not just cool any more". *Nature*, vol. 396, pp. 21-22 (1998).

Manna, L. et al., "Synthesis of soluble and processable rod-, arrow-, teardrop-, and tetrapod-shaped cdse nanocrystals". *J. Am. Chem. Soc.*, vol. 122, pp. 12700-12706 (2000).

Manoharam, V. N. et al., "Dense packing and symmetry in small clusters of microspheres". *Science*, vol. 301, pp. 483-487 (2003).

Mason, T. G., "Osmotically driven shape-dependent colloidal separations", *Phys. Rev. E*, vol. 66, pp. 60402/1-4 (2002).

Mokari, T. et al. "Selective growth of metal tips onto semiconductor quantum rods and tetrapods". *Science*, vol. 304, pp. 1787-1790 (2004).

Murphy, C. "Nanocubes and nanoboxes". *Science*, vol. 298, pp. 2139-2141 (2002).

Raviv, U. et al. "Cationic liposome-microtubule complexes: Pathways to the formation of two-state lipid-protein nanotubes with open or closed ends", *Proc. Nat. Acad. Sci.*, vol. 102, pp. 11167-11172 (2005).

Resnick, D. J. et al. "Improved step and flash imprint llithography templates for nanofabrication". *Microelectronic Engineering*, vol. 69, pp. 412-419 (2003).

Sheu, H. R. et al., "Phase separation in polystyrene latex interpenetrating polymer networks". *J. Polymer Sci. A*, vol. 28, pp. 629-651 (1990).

Shevchencko, E. V. et al., "Structural diversity in binary nanoparticle superlattices". *Nature*, vol. 439, pp. 55-59 (2006).

Sullivan, M. et al. "Control of colloids with gravity, temperature gradients, and electric fields", *J. Phys. Condens. Matter*, vol. 15, pp. S11-S18 (2003).

Sun, Hong-Bo et al., "two-Photon Photopolymerization and 3D Lithographic Microfabrication", APS (2004) vol. 170, pp. 169-273.

Tanaka, Tomokazu et al., "Rapid sub-diffraction-limit laser micro/nanoprocessing in a threshold material system", Applied Physics Letters, vol. 80, No. 2, pp. 312-314 (2002).

Tkachenko, A. V. "Morphological diversity of DNA-colloidal self-assembly", *Phys. Rev. Lett.*, vol. 89, pp. 148303/1-4 (2002).

Torquato, S. et al. "Is random close packing of spheres well defined?", *Phys. Rev. Lett.*, vol. 84, pp. 2064-2067 (2000).

Van Blaaderen, A. "Colloids get complex", *Nature*, vol. 439, pp. 545-546 (2006).

Van Der Kooij, F. M. et al. "Liquid crystal phase transitions in suspensions of polydisperse plate-like particles", *Nature*, vol. 406, pp. 868-871 (2000).

Van Dillen, T. et al., "Energy-dependent anisotropic deformation of colloidal silica particles under MeV Au irradiation", *Appl. Phys. Lett.*, vol. 78, pp. 910-912 (2001).

Weeks, E. R. et al., "Properties of cage rearrangements observed near the glass transition", *Phys. Rev. Lett.*, vol. 89, pp. 095704/1-4 (2002).

Wensink, H. H. et al., "Isotropic-nematic phase separation in asymmetrical rod-plate mixtures". *J. Chem. Phys.*, vol. 115, pp. 7319-7329 (2001).

Whitesides, G. M. et al., "Self-assembly at all scales". *Science*, vol. 295, pp. 2418-2421 (2002).

Wierenga, A. M. et al., "Low-shear viscosities of dilute dispersions of colloidal rodlike silica particles in cyclohexane", *J. Colloid Interface Sci.*, vol. 180, pp. 360-370 (1996).

Yethiraj, A. et al., "A colloidal model system with an interaction tunable from hard sphere to soft and dipolar", *Nature*, vol. 421, pp. 513-517 (2003).

International Search Report for PCT/US07/18365; dated Mar. 18, 2008 (2 pgs).

Written Opinion of the International Searching Authority; for PCT/US07/18365; dated Mar. 18, 2008 (7 pgs).

* cited by examiner

| No. | Step | Parameters | Description |
|---|---|---|---|
| 0 | Wafers | Silicon<br>Can be either N or P type<br><100><br>5"<br>Resistivity does not matter<br>600-650 microns thick | Platform for reuse to produce the particles |
| 1 | Clean | Quantity: Piranha 9:1 98% H2SO4 EMD SX 1244-5/30-32% H2O2 Sigma 316989<br>Temp: Heat to 110 °C<br>Time: 60 minute immersion in Teflon™ cassette<br>Apparatus: Imtec Acculine Model #: QRT/S-A2001/12 P/N: 10-000-1112 S/N: AT021489 | Removes all organics from wafers |
| 2 | Rinse | Quantity: Place cassette in a bucket with DI water until wafers are completely covered<br>Remove water<br>Flush cassette with DI water again wafers are covered<br>Temp: Room Temperature 25 °C<br>Time: Repeat 2-3 times<br>Apparatus: Polyethylene Bucket | Remove the acid from the wafers |
| 3 | Clean | Quantity: HF 52% aqueous solution Mallinckrodt 2648-08<br>Temp: Room Temperature 25 °C<br>Time: 5 minute dip in a Teflon™ cassette<br>Apparatus: Polypropylene box with lid | Oxide removal to increase hydrophobicity of surface and allow for a better surface coating during the spin coating procedure |
| 4 | Rinse | Quantity: Place cassette in a bucket with DI water until wafers are completely covered<br>Remove water<br>Flush cassette with DI water again wafers are covered<br>Temp: Room Temperature 25 °C<br>Time: Repeat 2-3 times<br>Apparatus: Polyethylene Bucket | Remove the acid from the wafers |
| 5 | Dry/Rinse | Apparatus: Semitool 260ST<br>Program:<br>Rinse 120 seconds at 1200 rpm<br>Dry 1 120 seconds at 1200 rpm<br>Dry 2 0 seconds at 0 rpm | Remove the excess water and does a preliminary drying using a heating element |
| 6 | Dehydration Bake | Temp: Heat to 200 °C<br>Time: 2 hour<br>Apparatus: VWR Scientific Model #: 1430MS | Remove any adsorbed water |
| 7 | Resist | Ominicoat™ Microchem<br>No Modifications | Sacraficical Layer |
| 8 | Spin Coat | Ominicoat™ Microchem<br>Using a 4" chuck center the wafer on the chuck<br>Amount: 2mL dispensed using a pipet on the center of the wafer.<br>Program:<br>Step 1: RPM: 1500 RPM/S: 750 Sec: 2<br>Step 2: RPM: 3000 RPM/S: 1000 Sec: 30<br>Step 3: RPM: 0 RPM/S: 1000 Sec: 0 | Sacraficial layer approximately 20 nm for use to remove the SU-8 layer that will be applied after.<br>Spin coating provides a method to create uniform films on |

FIG. 14A

| | | Apparatus: Cookson Electronics Specialty Coating Systems Model #: G3P-8 S/N: 136880-6 | wafers. |
|---|---|---|---|
| 9 | Baking | Temp: 190 °C<br>Time: 1 minute<br>Apparatus: Fisher Ceramic Hotplate<br>S/N 41ZNO372 | Removes the solvent used for casting the polymer |
| 10 | Resist w/ Fluorescence | Quantity:<br>15mL of SU-8 2001™ Microchem for every .001 grams of dye.<br>Dyes:<br><br>N-316™ (Green) Molecular Probes 6-(N-(7-nitrobenz-2-oxa-1,3-diazol-4-yl)amino)hexanoic acid (NBD-X)<br><br>A-50™ (Blue) Molecular Probes 2-anilinonaphthalene-6-sulfonic acid (2,6-ANS)<br><br>Nile Red (Red) Fluka 72485<br><br>Mix thoroughly by vortexing and sonicating to make sure all of the oil soluble dyes are dissolved | Addition of dyes to create fluorescent resist. Amount helps to prevent problems with crosslinking, especially present with Nile Red. |
| 11 | Spin Coat | The resist from Step 9 will be used, with either of the dyes, depending on application.<br>Using a 4" chuck center the wafer on the chuck<br>Amount: 2mL dispensed using a pipet on the center of the wafer.<br>Program:<br>Step 1: RPM: 1500   RPM/S: 750    Sec: 2<br>Step 2: RPM: 3000   RPM/S: 1000  Sec: 30<br>Step 3: RPM: 0        RPM/S: 1000  Sec: 0<br>Apparatus: Cookson Electronics Specialty Coating Systems Model #: G3P-8 S/N: 136880-6 | The resist with the dyes from which the particles will be produced out of. Spin coating provides a method to create uniform films on wafers. |
| 12 | Bake | Temp: 100 °C<br>Time: 1 minute<br>Apparatus: Fisher Ceramic Hotplate<br>S/N 41ZNO372 | Removes the solvent used for casting the polymer |
| 13 | Exposure | Expose using mercury i-line (365nm)<br>Dosage: 233mJ/cm$^2$<br>5X reduction projection<br>Apparatus: Ultratech 2145 5X reduction stepper | Causes the bonds of the photo-initiator to break and as a result produces an acid that ultimately will crosslink the polymer: epon su-8 (epoxide resin) |
| 14 | Post Bake | Temp: 100 °C<br>Time: 1 minute<br>Apparatus: Fisher Ceramic Hotplate<br>S/N 41ZNO372 | Causes an increase in the kinetics of the acid based reaction to crosslink the epoxide resin |
| 15 | Develop | SU-8 Developer ™ (Propylene glycol monomethyl ether acetate)<br>Place wafer in a crystallization dish<br>Amount: Not that important. Typically enough to cover | Removes all resist that was not exposed leaving behind the figures desired. Small |

FIG. 14B

| | | the wafer<br>Time: Approximately 1-2 minute needs sufficient agitation.<br>Approximately 20 seconds in a ultrasonic bath<br>Apparatus: Branson Ultrasonic Clean<br>Model: 5510<br>S/N: RNC020514467E | polymers that are more soluble in the organic solvent are removed. |
|---|---|---|---|
| 16 | Rinse | Isopropanol Fisher A416-4 Rinse<br>Amount: N/A<br>Apply enough using a squeeze bottle to rinse the developer from the wafer surface<br>Dry using Nitrogen | Stops the developer from continuing to attack the polymer and cleans it of any left over polymer |
| 17 | Lift-Off | After cleaning the crystallization dish.<br>Add the Omnicoat Developer ™ Microchem (2.28% by weight of tetramethyl ammonium hydroxide)<br>Amount: Enough to cover the wafer<br>Agitation is very important<br>Place in an ultrasonic bath<br>Time: Until all the particles are free of the wafer<br>Apparatus: Branson Ultrasonic Clean<br>Model: 5510<br>S/N: RNC020514467E | Removes and solubilizes the omnicoat present underneath the SU-8 particles |

FIG. 14C

Estimates of Number of Particles per Circular Wafer

| Wafer dia. (In) | Wafer dia. (cm) | Wafer area (cm^2) | Area per Particle (micron^2) | Particle Area Fraction (%) | Number of Particles on a Single Wafer |
|---|---|---|---|---|---|
| 2  | 5.1  | 20.3  | 100 | 50 | 10,129,012 |
| 3  | 7.6  | 45.6  | 100 | 50 | 22,790,277 |
| 4  | 10.2 | 81.0  | 100 | 50 | 40,516,048 |
| 5  | 12.7 | 126.6 | 100 | 50 | 63,306,325 |
| 6  | 15.2 | 182.3 | 100 | 50 | 91,161,108 |
| 8  | 20.3 | 324.1 | 100 | 50 | 162,064,192 |
| 12 | 30.5 | 729.3 | 100 | 50 | 364,644,432 |
| 2  | 5.1  | 20.3  | 10 | 50 | 101,290,120 |
| 3  | 7.6  | 45.6  | 10 | 50 | 227,902,770 |
| 4  | 10.2 | 81.0  | 10 | 50 | 405,160,480 |
| 5  | 12.7 | 126.6 | 10 | 50 | 633,063,250 |
| 6  | 15.2 | 182.3 | 10 | 50 | 911,611,080 |
| 8  | 20.3 | 324.1 | 10 | 50 | 1,620,641,920 |
| 12 | 30.5 | 729.3 | 10 | 50 | 3,646,444,320 |
| 2  | 5.1  | 20.3  | 1 | 50 | 1,012,901,200 |
| 3  | 7.6  | 45.6  | 1 | 50 | 2,279,027,700 |
| 4  | 10.2 | 81.0  | 1 | 50 | 4,051,604,800 |
| 5  | 12.7 | 126.6 | 1 | 50 | 6,330,632,500 |
| 6  | 15.2 | 182.3 | 1 | 50 | 9,116,110,800 |
| 8  | 20.3 | 324.1 | 1 | 50 | 16,206,419,200 |
| 12 | 30.5 | 729.3 | 1 | 50 | 36,464,443,200 |
| 2  | 5.1  | 20.3  | 0.1 | 50 | 10,129,012,000 |
| 3  | 7.6  | 45.6  | 0.1 | 50 | 22,790,277,000 |
| 4  | 10.2 | 81.0  | 0.1 | 50 | 40,516,048,000 |
| 5  | 12.7 | 126.6 | 0.1 | 50 | 63,306,325,000 |
| 6  | 15.2 | 182.3 | 0.1 | 50 | 91,161,108,000 |
| 8  | 20.3 | 324.1 | 0.1 | 50 | 162,064,192,000 |
| 12 | 30.5 | 729.3 | 0.1 | 50 | 364,644,432,000 |
| 2  | 5.1  | 20.3  | 0.01 | 50 | 101,290,120,000 |
| 3  | 7.6  | 45.6  | 0.01 | 50 | 227,902,770,000 |
| 4  | 10.2 | 81.0  | 0.01 | 50 | 405,160,480,000 |
| 5  | 12.7 | 126.6 | 0.01 | 50 | 633,063,250,000 |
| 6  | 15.2 | 182.3 | 0.01 | 50 | 911,611,080,000 |
| 8  | 20.3 | 324.1 | 0.01 | 50 | 1,620,641,920,000 |
| 12 | 30.5 | 729.3 | 0.01 | 50 | 3,646,444,320,000 |
| 2  | 5.1  | 20.3  | 0.001 | 50 | 1,012,901,200,000 |
| 3  | 7.6  | 45.6  | 0.001 | 50 | 2,279,027,700,000 |
| 4  | 10.2 | 81.0  | 0.001 | 50 | 4,051,604,800,000 |
| 5  | 12.7 | 126.6 | 0.001 | 50 | 6,330,632,500,000 |
| 6  | 15.2 | 182.3 | 0.001 | 50 | 9,116,110,800,000 |
| 8  | 20.3 | 324.1 | 0.001 | 50 | 16,206,419,200,000 |
| 12 | 30.5 | 729.3 | 0.001 | 50 | 36,464,443,200,000 |

FIG. 16A

Estimates of Number of Particles per Circular Wafer

| Wafer dia. (in) | Wafer dia. (cm) | Wafer area (cm^2) | Area per Particle (micron^2) | Particle Area Fraction (%) | Number of Particles on a Single Wafer |
|---|---|---|---|---|---|
| 2 | 5.1 | 20.3 | 10 | 5 | 10,129,012 |
| 3 | 7.6 | 45.6 | 10 | 5 | 22,790,277 |
| 4 | 10.2 | 81.0 | 10 | 5 | 40,516,048 |
| 5 | 12.7 | 126.6 | 10 | 5 | 63,306,325 |
| 6 | 15.2 | 182.3 | 10 | 5 | 91,161,108 |
| 8 | 20.3 | 324.1 | 10 | 5 | 162,064,192 |
| 12 | 30.5 | 729.3 | 10 | 5 | 364,644,432 |
| 2 | 5.1 | 20.3 | 10 | 10 | 20,258,024 |
| 3 | 7.6 | 45.6 | 10 | 10 | 45,580,554 |
| 4 | 10.2 | 81.0 | 10 | 10 | 81,032,096 |
| 5 | 12.7 | 126.6 | 10 | 10 | 126,612,650 |
| 6 | 15.2 | 182.3 | 10 | 10 | 182,322,216 |
| 8 | 20.3 | 324.1 | 10 | 10 | 324,128,384 |
| 12 | 30.5 | 729.3 | 10 | 10 | 729,288,864 |
| 2 | 5.1 | 20.3 | 10 | 20 | 40,516,048 |
| 3 | 7.6 | 45.6 | 10 | 20 | 91,161,108 |
| 4 | 10.2 | 81.0 | 10 | 20 | 162,064,192 |
| 5 | 12.7 | 126.6 | 10 | 20 | 253,225,300 |
| 6 | 15.2 | 182.3 | 10 | 20 | 364,644,432 |
| 8 | 20.3 | 324.1 | 10 | 20 | 648,256,768 |
| 12 | 30.5 | 729.3 | 10 | 20 | 1,458,577,728 |
| 2 | 5.1 | 20.3 | 10 | 30 | 60,774,072 |
| 3 | 7.6 | 45.6 | 10 | 30 | 136,741,662 |
| 4 | 10.2 | 81.0 | 10 | 30 | 243,096,288 |
| 5 | 12.7 | 126.6 | 10 | 30 | 379,837,950 |
| 6 | 15.2 | 182.3 | 10 | 30 | 546,966,648 |
| 8 | 20.3 | 324.1 | 10 | 30 | 972,385,152 |
| 12 | 30.5 | 729.3 | 10 | 30 | 2,187,866,592 |
| 2 | 5.1 | 20.3 | 10 | 50 | 101,290,120 |
| 3 | 7.6 | 45.6 | 10 | 50 | 227,902,770 |
| 4 | 10.2 | 81.0 | 10 | 50 | 405,160,480 |
| 5 | 12.7 | 126.6 | 10 | 50 | 633,063,250 |
| 6 | 15.2 | 182.3 | 10 | 50 | 911,611,080 |
| 8 | 20.3 | 324.1 | 10 | 50 | 1,620,641,920 |
| 12 | 30.5 | 729.3 | 10 | 50 | 3,646,444,320 |
| 2 | 5.1 | 20.3 | 10 | 70 | 141,806,168 |
| 3 | 7.6 | 45.6 | 10 | 70 | 319,063,878 |
| 4 | 10.2 | 81.0 | 10 | 70 | 567,224,672 |
| 5 | 12.7 | 126.6 | 10 | 70 | 886,288,550 |
| 6 | 15.2 | 182.3 | 10 | 70 | 1,276,255,512 |
| 8 | 20.3 | 324.1 | 10 | 70 | 2,268,898,688 |
| 12 | 30.5 | 729.3 | 10 | 70 | 5,105,022,048 |

FIG. 16B

CUSTOMIZED LITHOGRAPHIC PARTICLES

CROSS REFERENCE TO RELATED APPLICATIONS

This application claims priority to U.S. Provisional Application No. 60/838,160, filed Aug. 17, 2006, the entire contents of which are incorporated herein by reference.

This invention was made with Government support of Grant No. CHE-0450022, awarded by the National Science Foundation.

FIELD

Embodiments of this invention are directed to customized lithographic particles and methods and systems of producing lithographic particles. In some embodiments, the lithographic particles can be made with a reusable or disposable substrate.

BACKGROUND

One of the primary goals of synthetic colloidal chemistry is to create new kinds of particles that have a wide variety of shapes and functionalities and overall sizes in the range from a few microns to a few nanometers. The dominant approach taken by many groups worldwide is through bottom-up synthesis, including "self-assembly" (Whitesides, G. M.; Grzybowski, B. Science 2002, 295, 2418) of atomic, molecular, and supramolecular components. Self-assembled structures can be simple, such as spheres (Antl, L.; Goodwin, J. L.; Hill, R. D.; Ottewill, R. H.; Owens, S. M.; Papworth, S.; Waters, J. A. Colloid Surf. 1986, 17, 67) disks, (Mason, T. G. Phys. Rev. E 2002, 66, 60402), platelets (van der Kooij, F. M.; Kassapidou, K.; Lekkerkerker, H. N. W. Nature 2000, 406, 868), and cubes (Murphy, C. Science 2002, 298, 2139). They can also be more complex, such as tetrapods (Mokari, T.; Rothenberg, E.; Popov, I.; Costi, R.; Banin, U. Science 2004, 304, 1787), clusters (Manoharam, V. N.; Elsesser, M. T.; Pine, D. J. Science 2003, 301, 483), liposome-microtubule complexes (Raviv, U.; Needleman, D. J.; Li, Y.; Miller, H. P.; Wilson, L.; Safinya, C. R. Proc. Nat. Acad. Sci. 2005, 102, 11167), and colloidosomes (Dinsmore, A. D.; Hsu, M. F.; Nikolaides, M. G.; Marquez, M.; Baush, A. R.; Weitz, D. A. Science 2002, 298, 1006). Random thermal forces cause colloidal particles to diffuse rapidly in a liquid regardless of their structures; this Brownian motion can overcome gravity and keep the particles dispersed homogenously over long times (Russel, W. B.; Saville, D. A.; Schowalter, W. R. Colloidal Dispersions; Cambridge University Press: Cambridge, U.K., 1989). Despite the increasing sophistication of self-assembly approaches, including multistep procedures, that have produced a rich variety of new structures (van Blaaderen, A. Nature 2006, 439, 545), no universal recipe currently exists for creating monodisperse colloids that have arbitrarily prescribed shapes and sizes using bottom-up approaches. In addition, various groups have micromachined individual or small numbers of structures (P. Galajda et al, App. Phys. Lett. 78, Jan. 8, 2001; T. Tanaka, et al, App. Phys. Lett. 80, Jan. 14, 2002; H. Sun et al., APS 170, 169-293, 2004) or have employed raster scanning in parallel (J. Kato et al., App. Phys. Lett. 86, Jan. 18, 2005). However, these approaches are complex and have not been demonstrated to be scalable to the production of very large numbers of microscale or nanoscale particles. There is thus a need for improved methods of producing microscale and nanoscale particles and improvements in such particles produced.

SUMMARY

A method of producing particles according to some embodiments of the current invention include providing a substrate structure that comprises a solid substrate; forming a target structure on said substrate structure, said target structure comprising a radiation-reactive material; forming a spatially patterned beam of radiation using a patterned mask; exposing at least a portion of the target structure to the spatially patterned beam of radiation to which the radiation-reactive material reacts while leaving other portions of the target structure unexposed to the radiation; removing substantially all of one of the exposed or the unexposed patterned portions of the target structure to provide a plurality of non-contiguous structures that include at least a portion of the radiation-reactive material; and separating the plurality of non-contiguous structures comprising the radiation-reactive material from the substrate structure into a fluid material. Each non-contiguous structure of the radiation-reactive material provides at least a portion of a separate particle after the separation. Some embodiments of the current invention are directed to a plurality of particles produced according to the methods herein. Other aspects of the invention are direct to a manufacturing system to manufacture a plurality of such particles.

BRIEF DESCRIPTION OF THE DRAWINGS

FIGS. 14A-14C list detailed steps in tabular form of an example of producing particles according to an embodiment of the current invention.

FIGS. 16A-16B is a table summarizing some examples of the number of particles that can be made in a single pass of a single substrate structure through the manufacturing system of FIG. 15.

DETAILED DESCRIPTION

Figure 1:
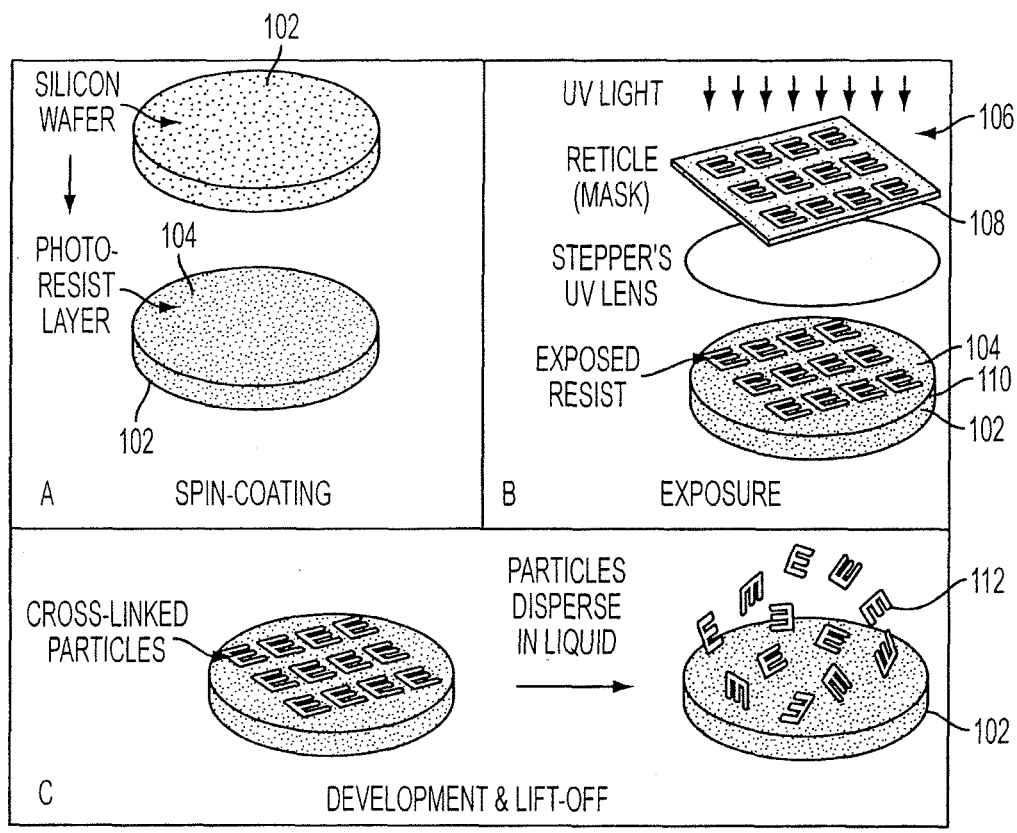
FIG. 1 is a schematic illustration of a method of making particles according to an embodiment of the current invention.

All references cited anywhere in this application are incorporated by reference herein. One of the current inventors has submitted a dissertation entitled "Novel Lithographic Techniques for the Production of Monodisperse Colloids: Litho-Particles" to The University of California, Los Angeles in May 2007, the entire contents of which are incorporated herein by reference.

Various embodiments of this invention are directed to customized lithographic particles and methods and systems of producing lithographic particles. Some embodiments of the current invention provide a process to mass produce microscale and/or nanoscale particles on a re-useable or disposable substrate by an automated patterning process that can simultaneously make many copies of a variety of desired patterns from a layer of a material of choice that has been deposited onto the substrate or onto layers of other materials that have been previously deposited onto the substrate. We refer to the layer or layers of a material of choice out of which the particles will ultimately be comprised as the "target layer(s)." The target layers can be part of more complex "target structures." Other layers of materials may also be deposited and removed to facilitate or accomplish the goal of patterning the material of choice. These layer(s) are called "non-target layer(s)." Once the patterns of the desired particle shapes have been created in the target layer(s) after removing at least some of the target material(s) to create disconnected or "non-contiguous" patterned particle structures, those particles are ultimately detached from the substrate by a separation procedure, which may involve chemical and/or mechanical means, known as "lift-off" or "release". The particles can be lifted off into a gas phase, supercritical fluid phase, a liquid phase, or even into a viscoelastic material.

For the discussion below, we frequently refer to lift-off into a liquid phase for simplicity. However, the general aspects of this invention are not limited to lift-off into only a liquid phase material. All other phases and materials listed above are also within the scope of this invention.

A general process for patterning materials is known as "lithography". The most successful of these lithography processes is optical lithography. This hinges from the fact that the technology to produce bright sources of collimated monochromatic photons (e.g. from a laser or a filtered mercury lamp) over a wide range of the electromagnetic spectrum is well known. Unlike electron beams, which repel each other due to their charged nature and are therefore difficult to employ for parallel exposure at high pattern density, photon beams are charge neutral and do not repel. Therefore, photons can be collimated and projected through a mask pattern, patterned mask, or simply "mask". This mask contains a spatial pattern of regions that reflect or absorb the photons in some regions but are transparent and transmit the photons readily in other regions. Other common terms used in lithography to describe a mask are "reticle" and "pellicle". A common example of a mask is a polished quartz plate that transmits light in a desired pattern except where a patterned thin chrome layer resides on its surface. By passing a uniform beam of light through a mask, one can form a beam of spatially patterned radiation that retains the essential structures of the patterns on the mask. This invention is not limited to a specific type of mask, such as in this example, and may include any of a variety of masks in some embodiments. Furthermore, this invention is not limited to only optical lithography and may include electron beam, charged particle, and neutral particle lithography.

The term "optical" is not intended to be limited to only visible light. It includes other regions of the electromagnetic spectrum that are not visible to the human eye. For example, ultrviolet light is currently quite commonly used in optical lithography. Optical lithography is also often refered to as photolithography. X-rays, whether soft or hard, are other forms of electromagnetic radiation.

The finest resolution of features that optical lithography can achieve is broadly set by the Rayleigh criterion. For most standard lithography approaches, the minimum feature size present in the desired pattern cannot be below roughly the wavelength divided by two. For mercury i-line light (ultraviolet light used in some examples by the current inventors), the wavelength is $\lambda=365$ nm, and therefore, the smallest feature size predicted by the Rayleigh criterion is about 180 nm. For deep-UV steppers, the smallest feature size can be less than 100 nm. Prototype commercial technology using deep-UV and special interference phase masks can already achieve minimum feature sizes of about 60 nm. Most technology experts agree that optical lithography with features of 30 nm will become a reality. Some experts suggest that the evolution in progress of the field of lithography will provide a means of producing patterned structures having feature sizes down to below 10 nm and even to features in the 1 nm range using new methods to create spatially patterned radiation.

In an embodiment of the current invention, the pattern contains one or many shapes of particles that we wish to create. More generally, it can contain up to many trillions of particles, all of which may have the same or a variety of different shapes. In present applications, the mask usually contains between one hundred million to one billion shapes for printing without reduction and about one million to ten million shapes for printing at five-fold (5x) reduction. In general, the number of particles is limited by many factors, including the surface area of the substrate, the lateral particle dimensions, the area fraction occupied by the particles. Using a stepper, we can simultaneously produce many replicas of the same shape or even a wide variety of different shapes. This approach is distinguished by other methods in micro electro-mechanical systems (MEMS) in the following ways: there is a lack of interconnection between the desired features in the plane (i.e. we make discrete features), and the desired discrete features that are created are completely detached from the solid surface and dispersed in a fluid phase.

The mask is generally made using a lithography device that is designed to provide very high resolution but is not designed for high-throughput, because features are typically written sequentially rather than in parallel. The most prominent technology for writing masks is electron-beam (e-beam) lithography. E-beam lithography can achieve line widths near and below 50 nm. For less stringent applications, the width of the writing e-beam is usually closer to 250 nm. More recently, direct write laser (DWL) technology can provide masks that have less demanding minimum feature sizes. Thus, the resolution of the mask can be tailored to the needs of the particular optical lithography system that will use it. The cost of the mask generally increases as its area becomes larger and the feature size becomes smaller. The minimum feature size of the mask, the degree of reduction of the optical lithography system, and the wavelength of light used by the optical lithography system therefore set limits on the minimum feature size and on the "fidelity" that the printed particles could have. Whether the mask transmits or blocks light depends on whether the photoresist to be used is "negative" or "positive". Generally, masks have the form of an absorbing or reflecting layer of metal or metal oxide on a solid surface (e.g. quartz). Masks can also be comprised of dielectric coatings for anti-reflection and other purposes.

In all of the optical exposure approaches we present herein, especially those that can be automated, such as with a stepper, at least one of the layers is a photosensitive resist that can be patterned with the desired shapes by exposure using the mask. In some cases, the photoresist layer will be the target layer, and in other cases the photoresist layer will be a non-target layer that will be used to assist in the patterning of a different target layer of material. Many different types of photoresist are available. The photoresist layer is a complex mixture of several chemicals that have been included for different purposes. Although compositions vary, photoresists generally contain: a liquid solvent base; monomer, oligomer, or polymer molecules (often called "resin") compatible with that solvent; cross-linking reactive molecules (optional); photo-reactive molecules (initiators or sensitizers) that may or may not provide for chain reactions and crosslinking; and surfactants (to aid in the spin-coating process). Here, as is common, the word photoresist can refer to either the liquid form of the photoresist composition prior that includes the solvent and also to the solid form of the photoresist composition after most or all of the solvent has been removed, usually through evaporation. Some photoresists are optically transparent in the visible spectrum; others appear dark-colored due to optical absorption in the visible spectrum. Some photoresists can only be exposed with certain wavelengths and are insensitive to other wavelengths. Negative photoresists become insoluble to that photoresists' developer by usually crosslinking where they have been exposed, and a post-exposure thermal "baking" step may be necessary. Negative photoresists are used in examples herein, but these processes could also be implemented using positive photoresists to make particles lithographically according to some embodiments of the current invention. Materials other than photoresists can be used in our methods and processes. For instance, electrons, neutrons, and x-rays can be used to cause reactions within a wide variety of solid materials that have been irradiated and make them susceptible to subsequent development.

In addition to exposure systems, a wide variety of semiconductor processing methods have been automated to a large degree. These include deposition methods, such as spin-coating, spraying, sputtering, chemical vapor deposition (CVD), and electron beam metal deposition (EBMD), electroplating, and dip-coating. They also include methods to remove materials selectively, such as chemical etching, reactive ion etching (RIE), gas-plasma etching, and developing. Track systems generally are assembly-line production and process each wafer individually through an automated moving track. Other approaches employ trays (known as "wafer boats") that can hold a large number of wafers and can be transferred robotically from one processing station to the next. Generally, each boat holds 25 to 50 wafers.

There are many ways of implementing the use of lithography to create and mass-produce discrete particles on a surface and release the particles from the surface into a fluid according to the some embodiments of the current invention. In the following description, we outline several embodiments as examples. The general concepts of this invention are not limited to only these specific examples. These processes include, but are not limited to, methods for creating particles that have simple slab-like shapes, as well as particles that have complex 3-d shapes comprised of many different materials. A very detailed description of an example of a method of making particles according to the current invention is contained in a flow diagram of FIG. 14. See also the examples described in "Colloidal Alphabet Soup: . . . " submitted to Nature by one of the current inventors. These include optical microscope images, fluorescence microscopy images and scanning electron microscope images of the particles that have been created. Related examples are also found in a publication by the inventors in the *Journal of Physical Chemistry C* ("Colloidal alphabet soup: Monodisperse dispersions of shape-designed LithoParticles" *J. Phys. Chem. C* 111, 4477-4480 (2007)).

After describing several embodiments of the current invention, we point out many possible variations to the embodiments that are provided as examples of some of the concepts of this invention. We also identify nuances of the possible material deposition and removal processes that can lead to a rich variety of compositions of the particles. We point out a variety of general applications of the particles. We also introduce the idea of designing the particle shapes and interactions to induce massively parallel self-assembly of different components in solution to simultaneously make many identical small multi-component devices.

FIG. 1 is a schematic illustration of a method of making particles, and the particles made by the method, according to an embodiment of the current invention. The method according to this embodiment of the current invention comprises providing a substrate structure 102 that comprises a solid substrate (FIG. 1a). The solid substrate may be, but is not limited to, a silicon wafer. In this embodiment, the substrate structure 102 can be the solid substrate itself, for example a clean silicon wafer. A target structure 104 is formed on the substrate structure 102. The target structure 104 comprises a layer of radiation-reactive material. For example, the target structure may be, or may include, a layer of photoresist. The radiation-reactive material according to the current invention is not limited to only photoresist materials. For example, if one were to use a patterned beam of charged particles, one would use a material appropriately reactive to such radiation. Spin-coating a layer of photoresist has been found to be a suitable method of forming a target structure 104 on the substrate structure 102. For example, Shipley AZ5214 photoresist spin coated onto a clean silicon wafer can be used according to this embodiment of the current invention. Alternatively, the substrate structure 102 may include a re-useable layer of material or surface coating applied to a solid substrate to prevent the target structure from sticking to it.

The method according to this embodiment of the current invention also includes forming a beam of spatially patterned radiation from a source uniformly intense radiation 106 using a patterned mask 108 (FIG. 1b). The pattern may be reduced in size with a lens system, such as by using a UV stepper, for example. However, the broad concepts of this invention are not limited to changing the size of the spatially patterned beam of radiation (i.e., it could be enlarged, reduced or left the same size). At least a portion of the target structure 104 is exposed to the spatially patterned beam of radiation (e.g., the letter "E" 110) while leaving other portions of the target structure 104 unexposed. Substantially all of the unexposed patterned portions of the target layer are then removed to provide a plurality of non-contiguous structures that include at least a portion of the radiation reactive material (FIG. 1c). In this example, the exposed portions undergo a chemical structure change, or reaction, that prevents then from being removed. This can be referred to as a development step. Alternatively, patterned regions of a target layer may undergo chemical changes or reactions so that they can be removed, in which case a negative image of the desired particle patterns would be used. The removal of unexposed (or alternatively, exposed) portions of the target layer can be dissolving the unexposed (or exposed) portions in a developing-type of process. The plurality of non-contiguous structures (e.g., 112) that include at least a portion of the radiation-reactive material are separated from the substrate structure 102 to provide a plurality of separate particles. In this embodiment, the photoresist does not bind strongly to the solid substrate so the removal of portions of the target layer (e.g., developing) and separating can be accomplished essentially simultaneously. For example, fluid flow of a developer solution and/or mechanical movement (vibration, agitation, etc) of the solid substrate can provide the separating in some embodiments. Separating the particles from the substrate structure may also be referred to as "lift-off," but it is not intended to be limited to any narrowing interpretation of "lift-off." For example, it may include cases in which there is actually no "lifting" of the particles.

Figure 2:
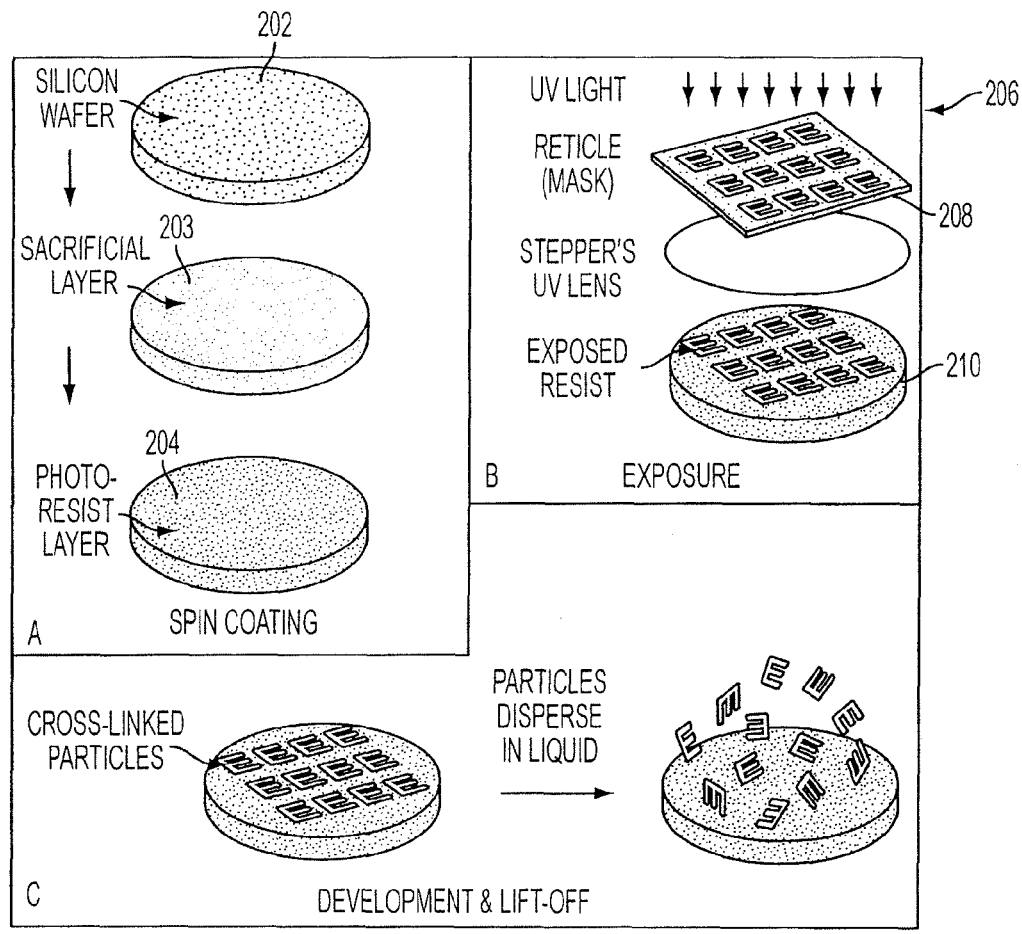
FIG. 2 is a schematic illustration of a method of making particles according to another embodiment of the current invention.

FIG. 2 is a schematic illustration of a method of making particles, and the particles made by the method, according to another embodiment of the current invention. The method according to this embodiment of the current invention comprises providing a substrate structure 202 that comprises a solid substrate (FIG. 2a). The solid substrate may be, but is not limited to, a silicon wafer. In this embodiment, the substrate structure 202 includes a sacrificial layer 203 of material formed on a solid substrate. A target structure 204 is formed on the substrate structure 202. The target structure 204 comprises a layer of radiation-reactive material. According to the current embodiment, SU-8 resin without a photoinitiator is a radiation-non-reactive material suitable for the sacrificial layer 203 and a similar SU-8 photoresist containing a photoinitiator can be used for the target structure 204. The SU-8 resin adheres strongly to the silicon wafer's surface. SU-8 resin without a photoinitiator can be deposit using spin-coating to provide the non-target sacrificial layer 203. Then SU-8 photoresist with a photoinitiator can be deposited by spin-coating to provide a target layer of radiation-reactive material.

The method according to this embodiment of the current invention also includes forming a spatially patterned beam of radiation 206 using a patterned mask 208 (FIG. 2b), similar to the embodiment described above. At least a portion of the target structure 204 is exposed to the spatially patterned beam of radiation (e.g., the letter "E" 210) while leaving other portions of the target structure 204 unexposed. Substantially all of the unexposed patterned portions of the target layer are then removed to provide a plurality of non-contiguous structures that include at least a portion of the radiation reactive material (FIG. 2c), similar to the embodiment described above. In this embodiment, the SU-8 resin, for example, is contained both in the sacrificial layer and the target layer, so the removal of portions of the target layer (e.g., developing) and separating can be accomplished essentially simultaneously by the same developer solution. In this case, the sacrificial layer 203 and the unexposed (or exposed) target layer both dissolve together in the developing step. After developing, the non-target layer is essentially completely dissolved along with the unexposed areas of the target layer, releasing the cross-linked particles into the developer solution. For SU-8, an organic developer is propylene glycol monomethyl ether acetate. Development and lift-off steps are not separate in this embodiment. The dissolved photoresist in the developer can be removed with subsequent solvent exchange steps.

Figure 3:
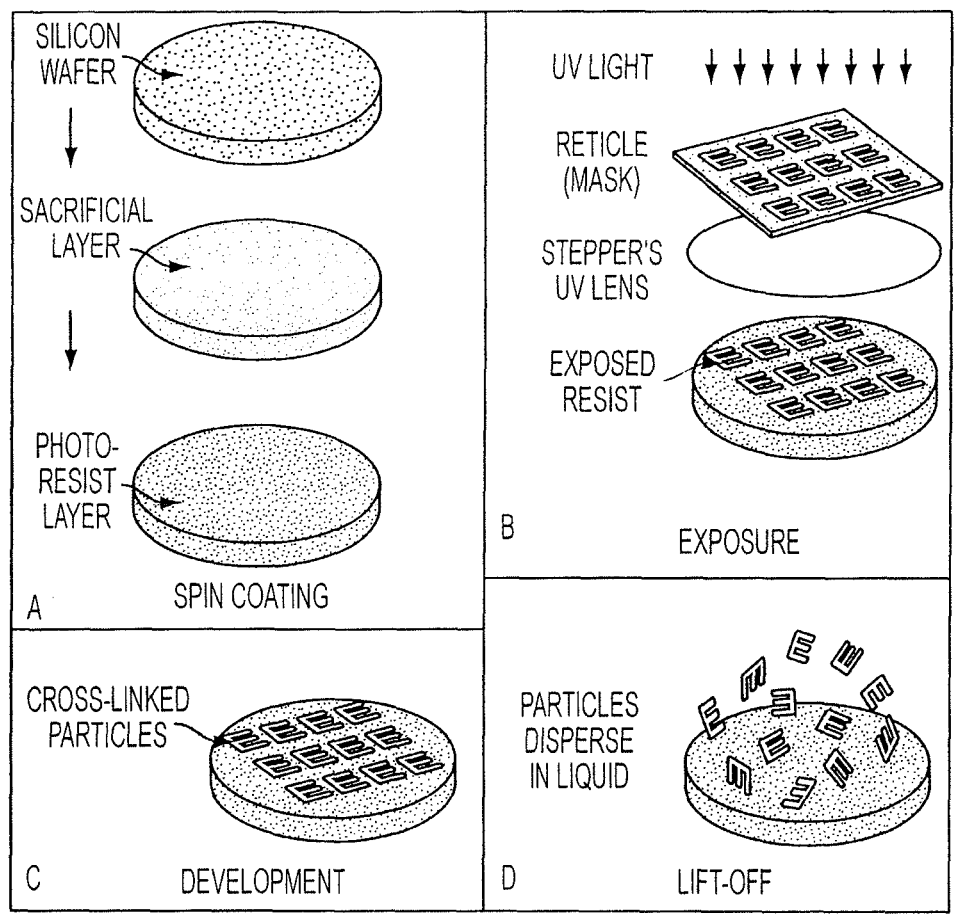
FIG. 3 is a schematic illustration of a method of making particles according to another embodiment of the current invention.

FIG. 3 is a schematic illustration of a method of making particles, and the particles made by the method, according to another embodiment of the current invention. The method according to this embodiment of the invention is similar to the embodiments described above in that only one target layer and one non-target sacrificial layer are used. However, it differs in that the sacrificial layer is comprised of material that is not soluble in the developer of the target photoresist layer. This has been reduced to practice with excellent results using SU-8 photoresist for the target layer and Omnicoat for the sacrificial layer. Since SU-8 uses an organic developer and Omnicoat uses an immiscible aqueous developer, the particles can be retained on the surface and the lift-off step can be separated from development. In other words, SU-8 developer does not dissolve Omnicoat, so the particles can be lifted-off into an aqueous solution on demand. This method has been found to provide consistent and high-fidelity particles.

Figure 4:
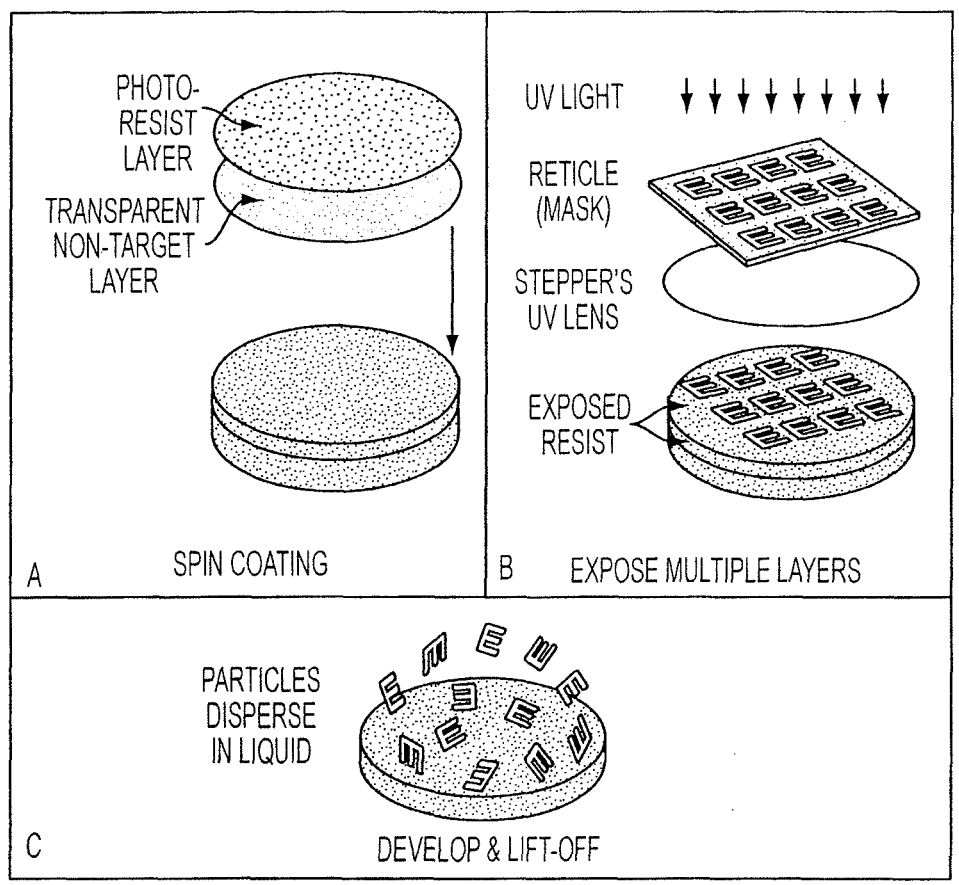
FIG. 4 is a schematic illustration of a method of making particles according to another embodiment of the current invention.

FIG. 4 is a schematic illustration of a method of making particles, and the particles made by the method, according to another embodiment of the current invention.

This embodiment of the invention can be similar to the previously described embodiments, except that the target structure has two or more layers of radiation-sensitive material in which successive layers of radiation-sensitive material are separated by a layer of non-radiation-sensitive material. Herein, "radiation-sensitive" and "radiation-reactive" imply that the material is altered in some manner by the radiation. This embodiment of the current invention can take advantage of the excellent collimation of steppers to expose and develop multiple target layers at the same time, thereby increasing the throughput of particles produced in a single sequence of steps. All of the layers should permit at least some of the radiation being used for the exposure (e.g. UV light) to reach all of the radiation-reactive target layers without a large reduction in intensity from the top target layer to the bottom target layer.

It is possible, and even desirable in some cases, for the materials in the target structure to not be strictly transparent to the radiation being used for exposure, provided that the radiation can still penetrate over the small distances to cause the radiation-reactive material within the target structure to react. In yet other cases, by controlling the depth of penetration of the radiation into the target structure, it is possible and even desirable to pattern only the top portion of a layer of the radiation-reactive material.

Figure 5:
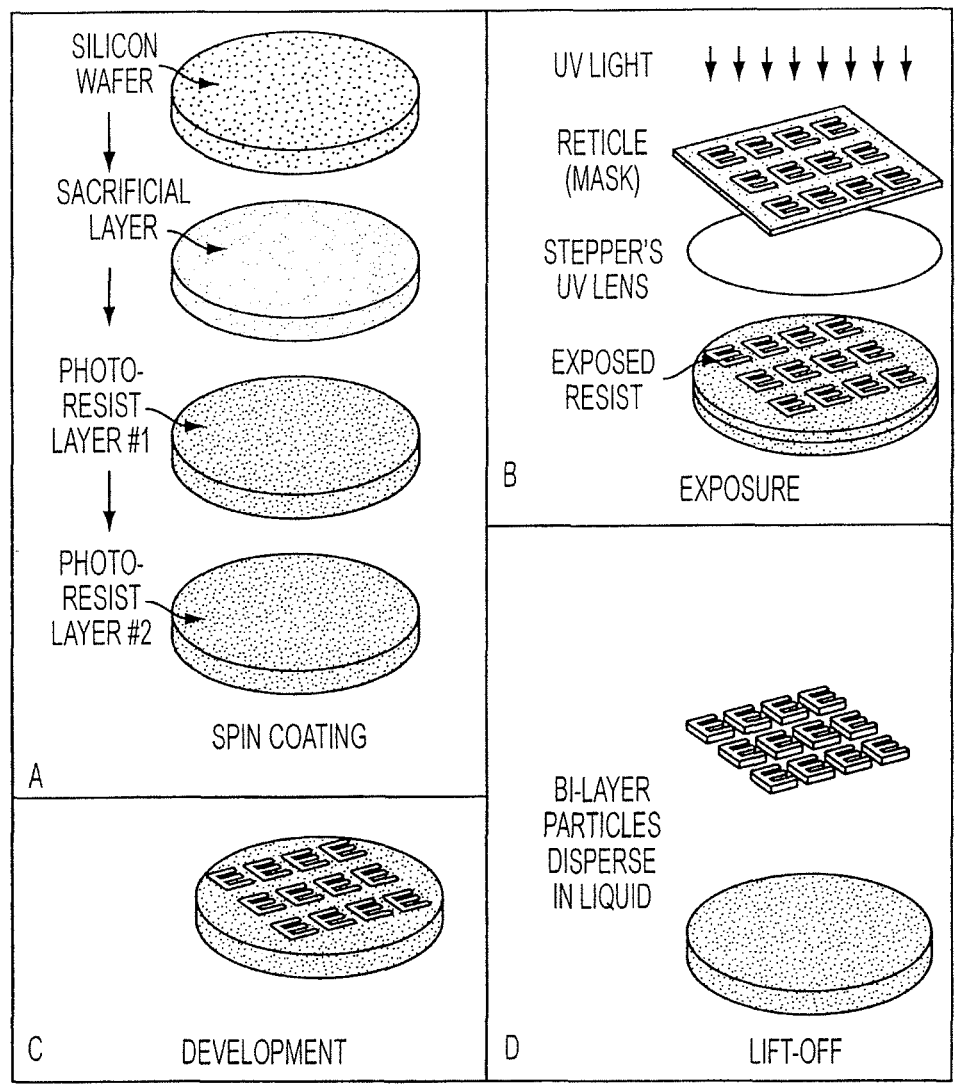
FIG. 5 is a schematic illustration of a method of making particles according to another embodiment of the current invention.

FIG. 5 is a schematic illustration of a method of making particles, and the particles made by the method, according to another embodiment of the current invention. This is similar to previously described embodiments except that it includes spin coating multiple layers of target photoresist to provide a target structure having a plurality of layers of radiation-reactive material. Each layer of radiation-reactive material can contain different internal compositions such as particles, dyes, or other components. The target structure can be formed directly onto the solid substrate, or onto a substrate structure, for example a substrate structure that includes a solid substrate and a sacrificial layer. This embodiment can provide a layered structuring of the particles with different material properties, yet having substantially a single cross-section and produced with a single exposure. For instance, this method has been used to make custom-shaped particles that contain striped layers of an SU-8 photoresist into which different fluorescent dyes have been incorporated.

Figure 6:
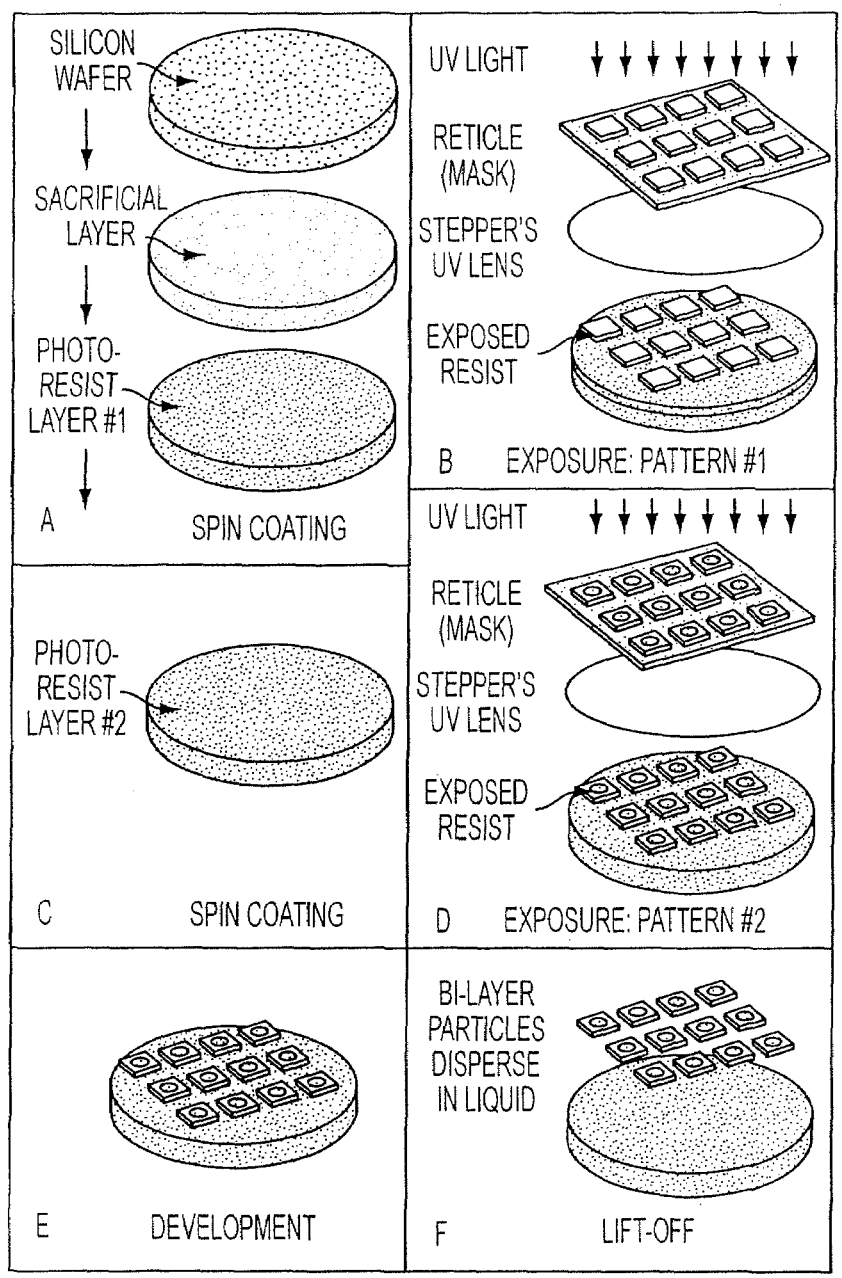
FIG. 6 is a schematic illustration of a method of making particles according to another embodiment of the current invention.

FIG. 6 is a schematic illustration of a method of making particles, and the particles made by the method, according to another embodiment of the current invention. As with the previous embodiment for multilayer particles, more than one target resist layer is used. However, in this case, the target layer nearest to the wafer is exposed first, but not baked or developed. A second layer of resist (possibly with a different internal composition) is spin-coated on top of the first layer of resist and then exposed to a different mask pattern, so that wafer and mask are aligned with respect to the previous layer. This process can be repeated for creating an even larger number of layers. Finally, all layers are baked and developed, leaving complex 3-d shaped lithographic particles on the sacrificial layer. In the limit of a large number of cross-sections and many thin layers, substantially smooth three-dimensional shapes can be mass-produced. One may select mask patterns for upper layers that do not expose empty regions that are desired in lower layers, thereby effectively filling them. An example of a compatible configuration is a bi-layer square cup comprised of an upper square toroid on a lower square plate. In this example, the layers of target material are substantially similar and compatible so that they mechanically interconnect through simple contact.

Figure 7:
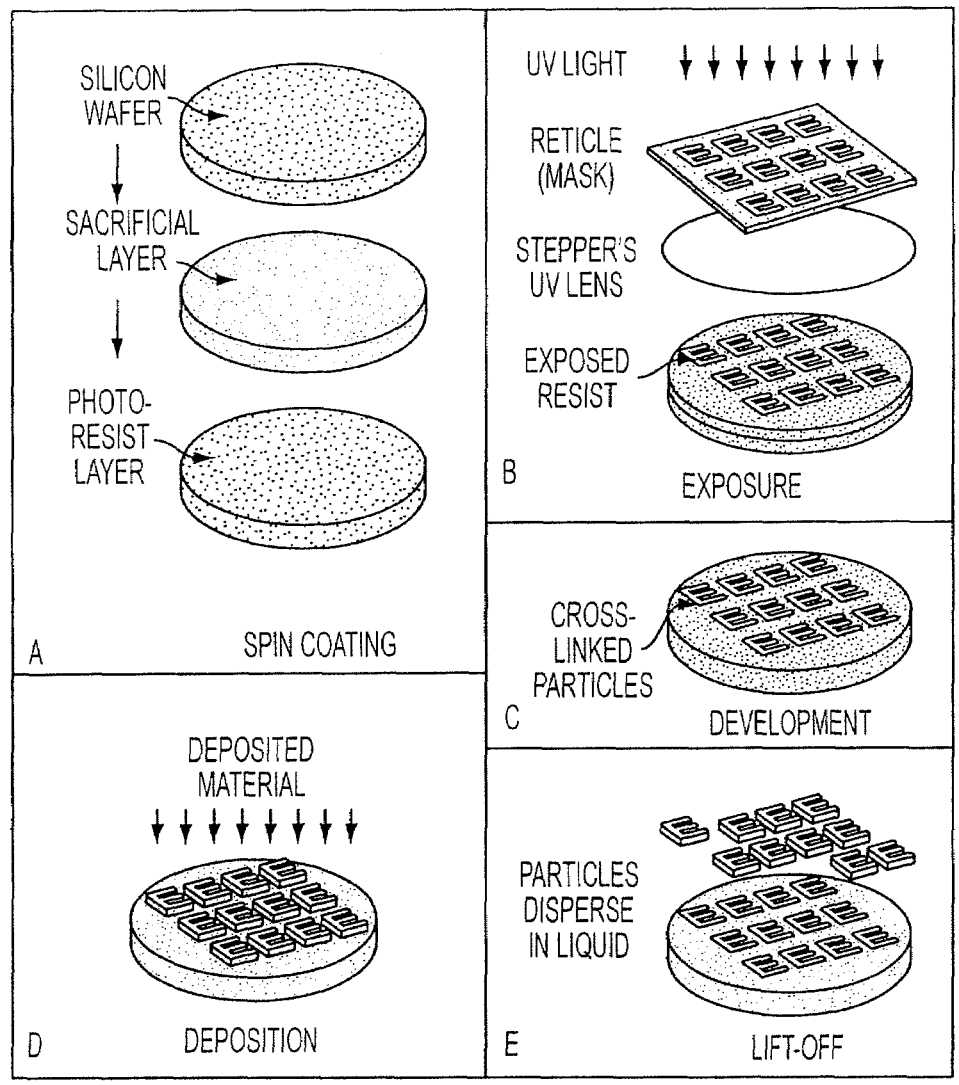
FIG. 7 is a schematic illustration of a method of making particles according to another embodiment of the current invention.

FIG. 7 is a schematic illustration of a method of making particles, and the particles made by the method, according to another embodiment of the current invention. This embodiment is similar to the embodiment of FIG. 3 except material is deposited on the exposed particles after the removal of the unexposed (or exposed) radiation-reactive material, but before the separating of the plurality of particles from the substrate structure. Suitable deposition methods may include sputtering, chemical vapor deposition, molecular beam deposition, electron beam metal deposition, and ion implantation. The thickness of the deposited layer usually does not exceed the thickness of the lower photoresist layer, but for very thin photoresist layers, it is possible to deposit a layer that is thicker than the photoresist layer according to this embodiment of the current invention. If there are adhesion problems between the materials, the surface of the developed wafer can be treated with adhesion promoters prior to the deposition. The use of SU-8 photoresist and by sputtering a thin gold layer during the deposition step has been found to produce robust bi-layer particles according to this embodiment of the current invention.

Figure 8:
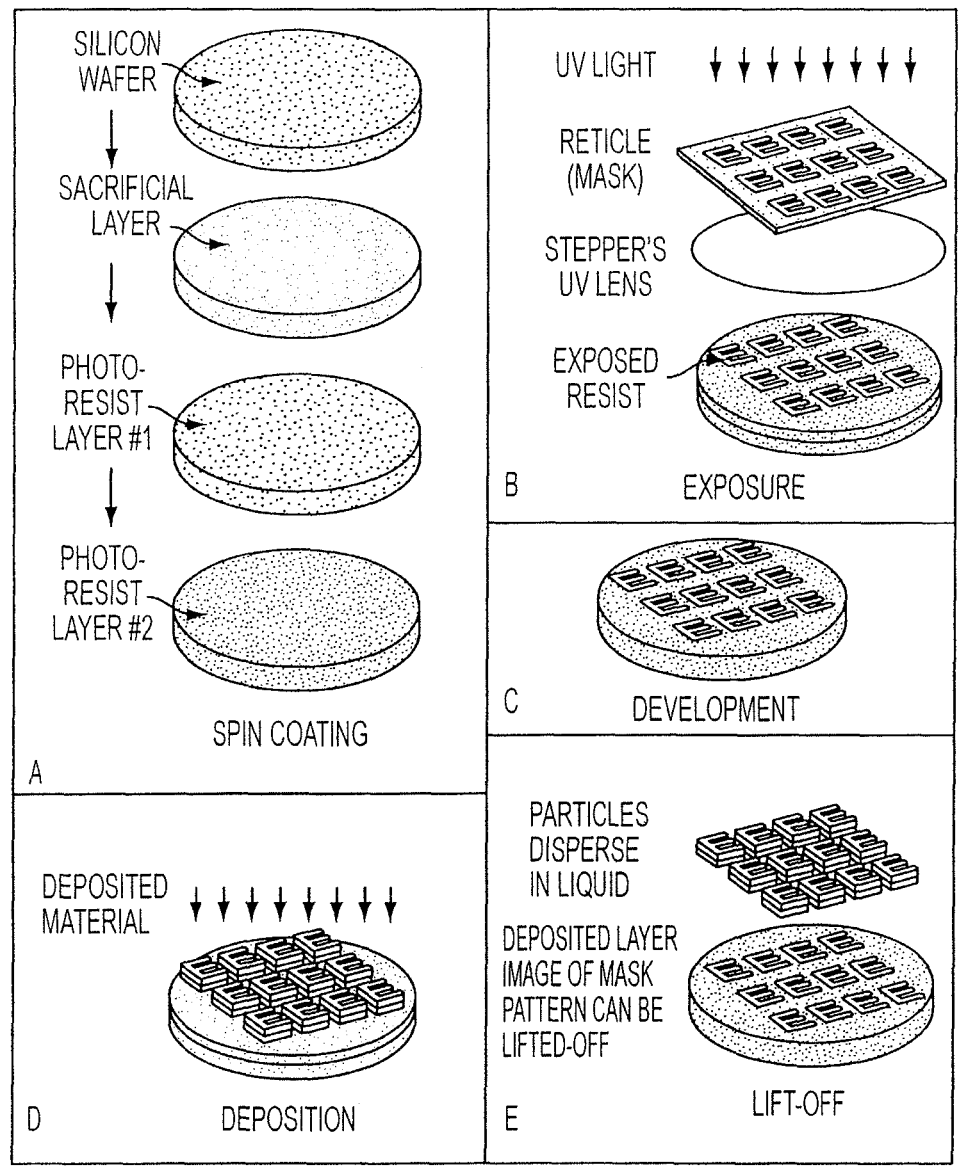
FIG. 8 is a schematic illustration of a method of making particles according to another embodiment of the current invention.

FIG. 8 is a schematic illustration of a method of making particles, and the particles made by the method, according to another embodiment of the current invention. This embodiment is similar to a combination of the embodiments of FIGS. 5 and 7 in which a target structure may have two or more target layers of radiation-reactive material formed on a substrate structure that includes a sacrificial layer and the removal step (development) is followed by one or more deposition steps. Although the deposited material can reduce the speed of lift-off into the liquid, completely dissolving the sacrificial layer can cause not only the particles, but also a thin-layer replica of the mask, to lift off into solution. Due to its substantially larger dimensions compared to those of the particles, this thin-layer replica can be separated from the particles in the fluid, and it can be either retained or discarded.

Figure 9:
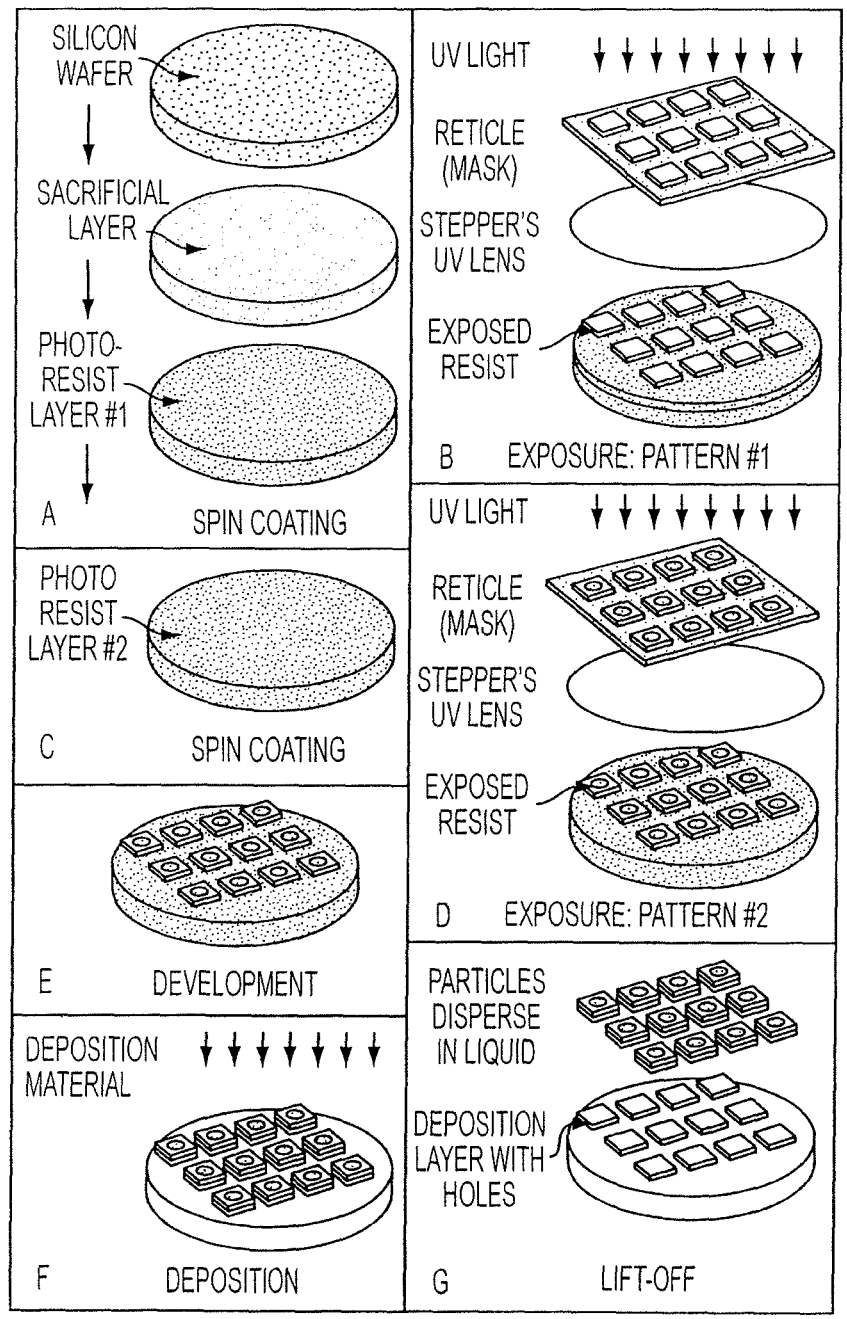
FIG. 9 is a schematic illustration of a method of making particles according to another embodiment of the current invention.

FIG. 9 is a schematic illustration of a method of making particles, and the particles made by the method, according to another embodiment of the current invention. This embodiment is similar to the embodiment of FIG. 6, but it includes one or more post-development deposition steps.

Figure 10:
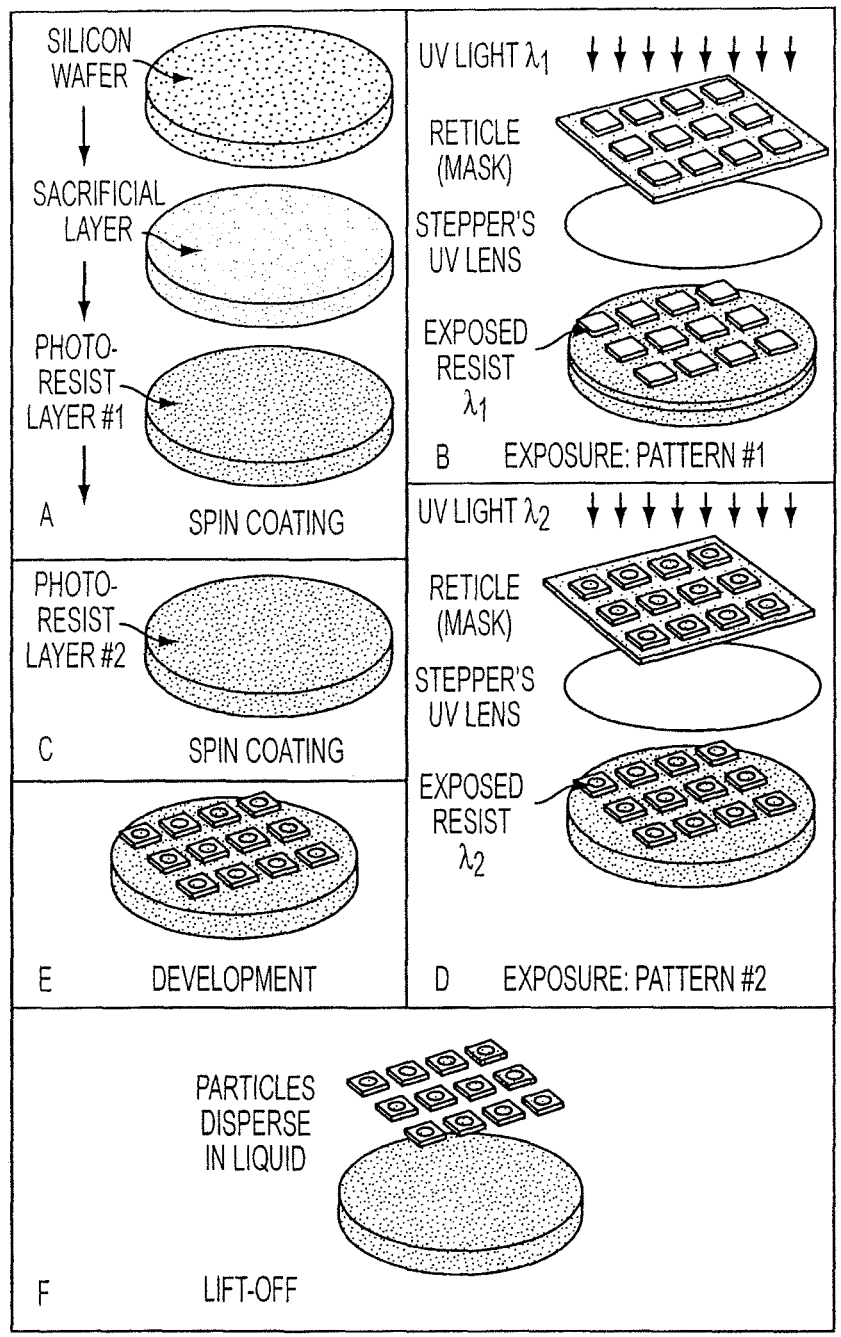
FIG. 10 is a schematic illustration of a method of making particles according to another embodiment of the current invention.

FIG. 10 is a schematic illustration of a method of making particles, and the particles made by the method, according to another embodiment of the current invention. This embodiment is similar to the embodiment of FIG. 6 except it can provide complex three-dimensional geometries that have overhanging features as a result of exposures using more than one mask. The embodiment of FIG. 6 does not provide overhanging features because exposure will crosslink the photoresist in all exposed layers, not just the most recently deposited layer if the radiation penetrates to the lower layers at a high enough intensity to cause the lower layers to also react. In the current embodiment, the range of possible shapes is much greater, but it involves using resists that have different wavelength sensitivity. The wavelength of the source is either changed (e.g. from i-line to g-line) or the source is filtered when the mask is changed in order to provide cross-linking specificity to a particular layer without inducing cross-linking in the neighboring layer. Since certain "short-wavelength" resists crosslink when exposed to shorter-wavelengths but do not crosslink significantly when illuminated with longer wavelength light, two or more layers can be deposited according to the current embodiment to create an overhanging feature.

Figure 11:
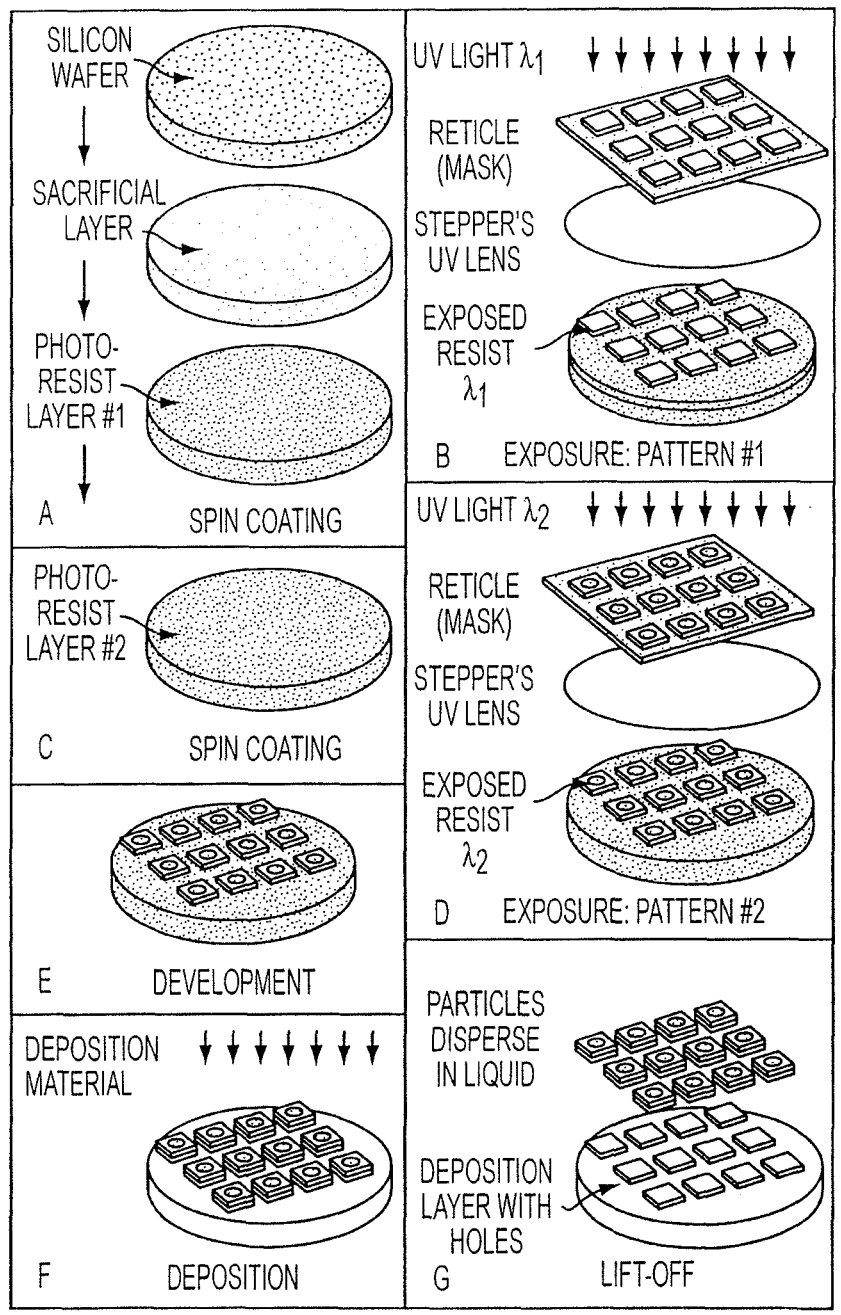
FIG. 11 is a schematic illustration of a method of making particles according to another embodiment of the current invention.

FIG. 11 is a schematic illustration of a method of making particles, and the particles made by the method, according to another embodiment of the current invention. This embodiment is similar to the embodiment of FIG. 10, but includes a post-development deposition step or steps.

Figure 12:
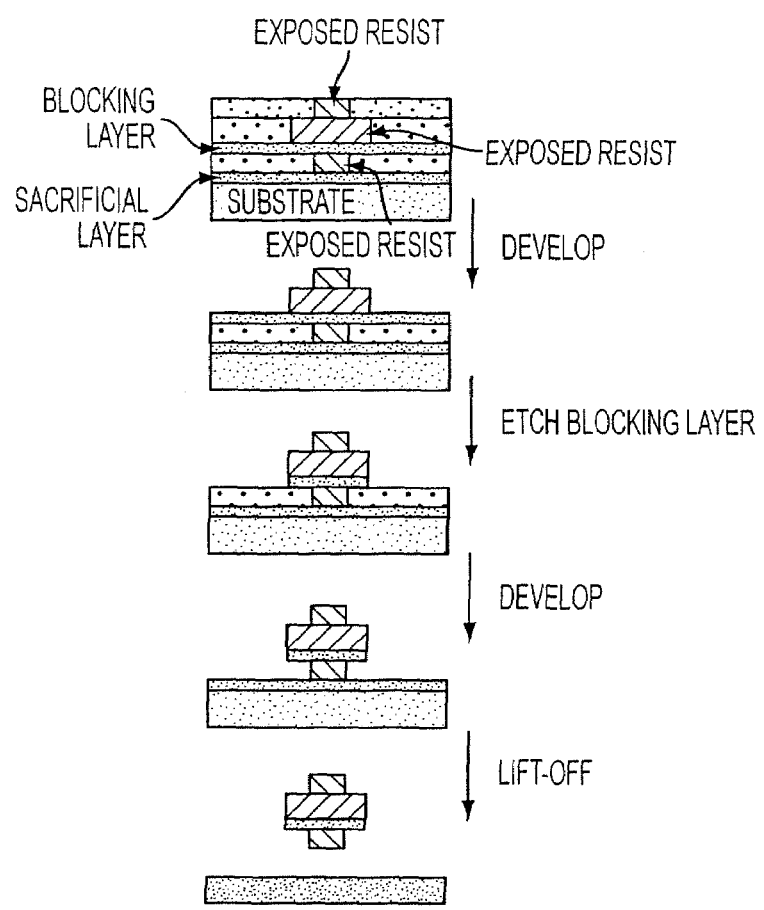
FIG. 12 is a schematic illustration of a method of making particles according to another embodiment of the current invention.

FIG. 12 is a schematic illustration of a method of making particles, and the particles made by the method, according to another embodiment of the current invention. This embodiment can include processes from several of the previous embodiments, but it includes an intermediate step in which a layer of material that blocks the patterned beam of radiation (e.g., UV light) to protect lower layers from being exposed and cross-linked by the overhanging pattern. The composition of the particles may not be uniform in this case, and therefore they may be 'hybrid' (e.g., polymer-metal or polymer-inorganic). This embodiment can provide a means to accomplish overhanging shapes without the need for variable wavelength exposures, a feature that many lithography devices do not offer. In the example shown, the starting state is created by: depositing a sacrificial layer onto the substrate, depositing a resist layer, exposing the resist layer with mask pattern #1, depositing a UV blocking layer (e.g. thin metal layer), depositing a second resist layer, exposing the second resist layer with mask pattern #2 (that extends beyond the outline of the pattern of mask #1 to create an overhang), depositing a third resist layer, and exposing the third resist layer with mask pattern #1. The third resist layer does not overhang the second. If it did, it would be necessary to insert another blocking layer. The blocking layer may impede the development of the lower resist layer, so it may be necessary to etch through it and develop again. The developer solution should not strongly attack the blocking layer.

Figure 13:
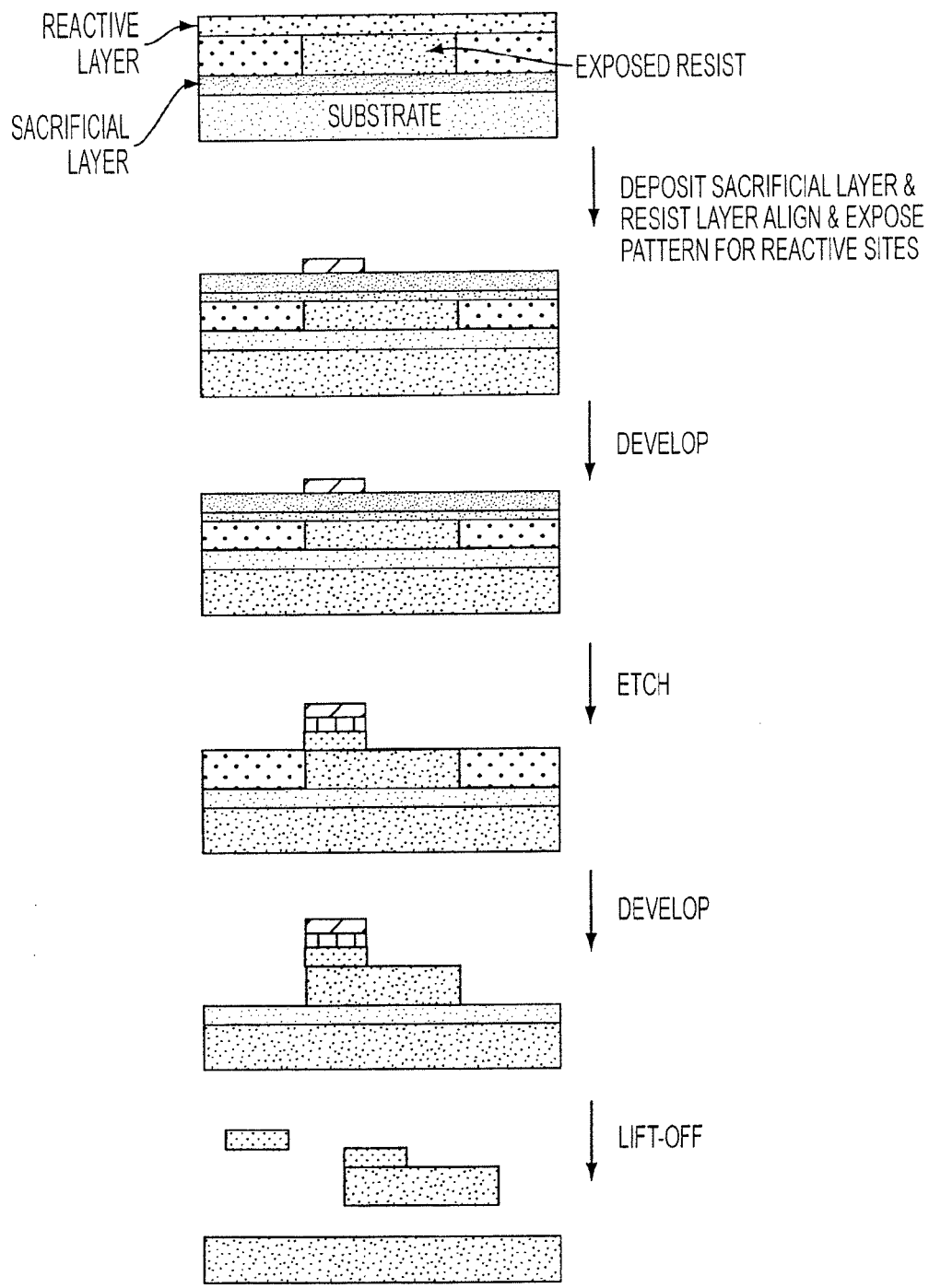
FIG. 13 is a schematic illustration of a method of making particles according to another embodiment of the current invention.

FIG. 13 is a schematic illustration of a method of making particles, and the particles made by the method, according to another embodiment of the current invention. An additional lithography sequence can be added to the embodiment of FIG. 12 to put reactive sites at pre-determined locations on the surfaces of the particles. These reactive sites would allow for the insertion of site-specific linking molecules that would provide a means to direct the parallel self-assembly of various components in solution. The process that is shown places sites on the top particle surface. A similar process to the one shown could be used to place sites on the bottom of particle surfaces. These processes do not provide a direct means for placing the sites on the sides of the particles. Smaller resist pieces covering the reactive sites can be separated. If, for example, the reactive material is gold, one can use thiol chemistry to attach particular types of derivatized complementary molecular stickers, such as streptavidin or biotin, to a particular location on the particles' surfaces.

FIGS. 14A-14C list detailed steps in tabular form of an example of producing particles according to the current invention. These steps cover up to the point of lift-off. Including an additional step or steps, subsequent to the development step, that provide for surface modification of the particles to suppress aggregation can be added to this list and can be adapted into other realizations.

Figure 15:
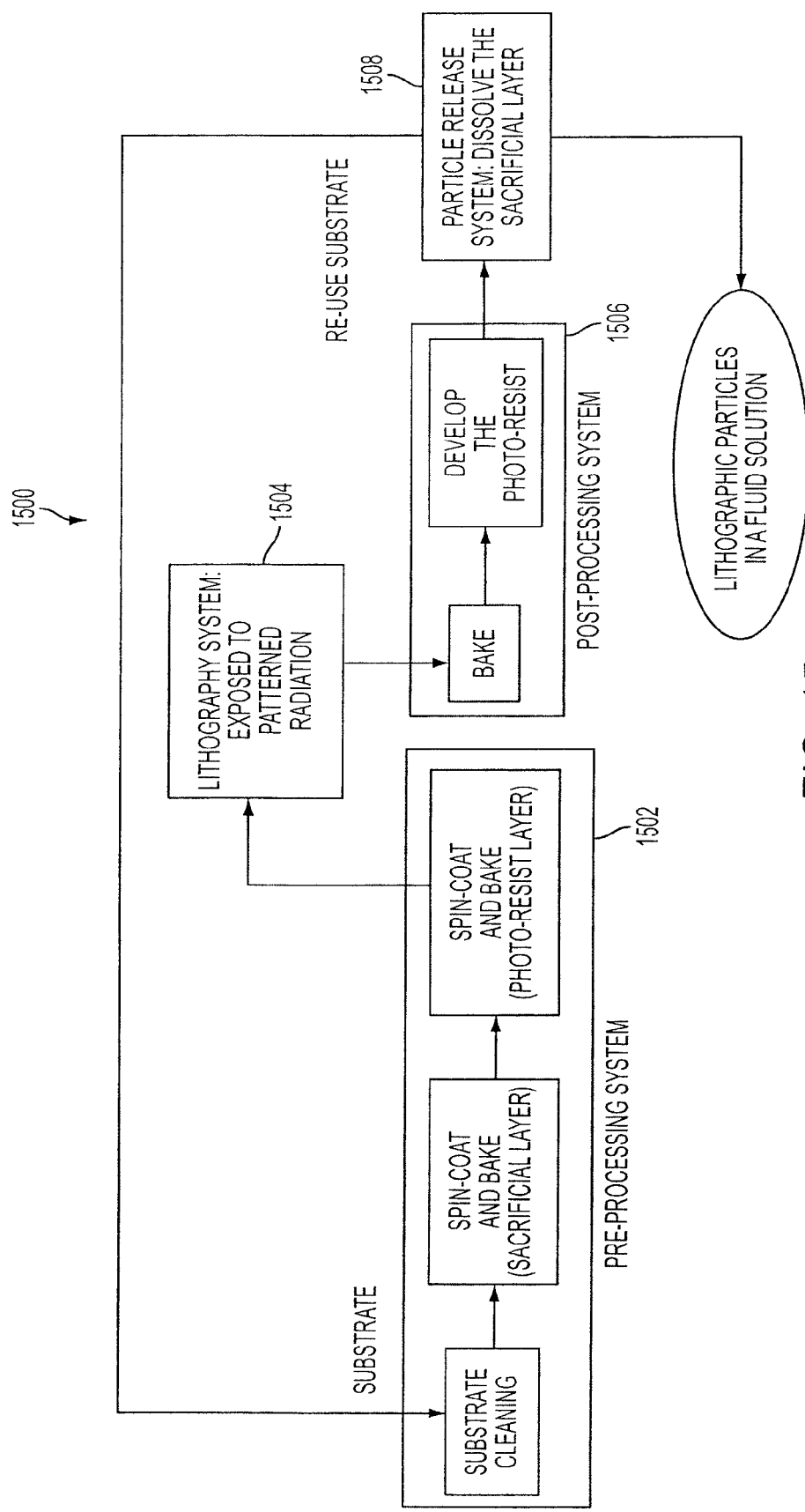
FIG. 15 is a schematic illustration of an automated manufacturing system according to an embodiment of the current invention.

FIG. 15 is a schematic illustration of an automated manufacturing system 1500 according to an embodiment of the current invention. The manufacturing system 1500 has a substrate pre-processing system 1502, a lithographic system 1504, a post-processing system 1506, and a particle release system 1508. The pre-processing system 1502 can be constructed to clean substrates and spin-coat and bake sacrificial and photoresist layers. The lithography system 1504 is constructed to expose a target structure to patterned radiation. For example, the lithography system 1504 can be a photolithography system. The post-processing system 1506 can be constructed to bake and develop substrate structures that have the exposed target structures thereon. The particle release system 1508 can dissolve, for example, sacrificial layers to release the particle. The solid substrate of the substrate structure can be reused in some embodiment of the current invention. In another embodiment, disposable substrates may be used. The particles from the particle-release system may undergo further processing and/or mixing with other components.

FIG. 16 is a table summarizing some examples of the number of particles that can be made in a single pass of a single substrate structure through the manufacturing system 1500. Since these are simple estimates, the numbers of particles per wafer are accurate to only the first three significant figures.

Properties of Photo-Sensitive "Resist" Layers:

The photo-resist layer contains molecules that undergo photon-induced reactions for light having specific wavelengths. The resist can be tailored to have sensitivity to different wavelengths. The exposure device must produce enough light at the wavelengths specified for reactions to occur in the resist to carry out the desired reaction (e.g. cross-linking). Some resists crosslink when they are exposed to the light; other resists can degrade in the exposed regions. In the above description, we refer to negative resists that crosslink in the exposed areas, but positive resists could be used in these processes with mask patterns that have the inverse pattern. For many resists, a thermal process, such as baking at a higher temperature, is used after exposure to enhance the microscopic chemical processes, such as cross-linking.

The resist may contain polymers or other molecules that have a wide variety of compositions. Some examples include: poly-hydrocarbons, poly-siloxanes, poly-fluorinated hydrocarbons, poly-alcohols, poly-epoxies, and polypeptides.

Molecules, nanoparticles, and microparticles that are compatible with the liquid base and the primary components of the resist can be incorporated into resists at dilute concentrations, and even high concentrations are possible in some situations. The ability to incorporate these additional potentially desirable components into the resist has been demonstrated for fluorescent dyes and nanoparticles, and this approach can be extended to many other materials. Some factors limiting the incorporation of these materials, which typically have sizes comparable to or smaller than the particle thickness, are: problems with deposition (e.g. streaking during spin-coating), exposure (e.g. additive inhibits photo-sensitivity), or mechanical integrity (e.g. additive causes particles to fall apart). These factors typically only limit the useful range of composition (e.g. volume fraction) of the incorporated material. In general, a wide range of materials can be successfully incorporated inside the particles. Such incorporated materials may also decorate the surfaces of the particles.

In most cases, a sacrificial layer can be created by including all of the components of a resist except the photosensitive molecules. This sacrificial layer will not cross-link when exposed, so it can be completely removed by using a developer that dissolves uncross-linked material. In some examples, we use either SU-8 resin without photoinitiator molecules or Omnicoat (water-soluble) as a sacrificial layer, and we use SU-8 photoresist with photoinitiator molecules or AZ5214 as a resist layer.

An exposure matrix can be performed using a test pattern to determine the exposure levels required to properly cause a reaction in the resist. We assume that the exposure settings on the lithography device have been adjusted to provide an appropriate exposure. In the examples described above, the deposited layer is a solid because our process typically involves solids. However, viscoelastic or liquid-like photoresist solutions could in principle be placed on a flat substrate and cross-linked through exposure before the solvent evaporates to form non-contiguous particle structures. The general concepts of the invention are intended to include non-solid layers. Such a liquid layer could be deposited by spraying or spin coating without a baking step.

Masks can be made by Several High-Fidelity Methods:
- Electron-beam lithography (at present the best method)
- X-ray lithography (not commercial)
- Direct-write laser lithography (e.g. Heidelberg DWL)
- Extremely high-resolution laser-printing The current invention is not intended to be limited to any of these specific examples of masks. For "reduction" steppers, the mask can have features that are up to 5 to 10 times larger than the actual printed structures. This can make the mask cost much less, yet still provide excellent fidelity of the features. The word 'reduction' comes from the fact that the stepper's lens reduces the length dimensions associated with beam of spatially patterned radiation before this radiation reaches the resist layer (i.e. creating a reduced image size of patterns on the mask). Generally, the mask can contain alignment marks and other identifying features that the stepper can use according to manufacturer specifications in order to align wafers to the mask during successive exposures with positional accuracy to about 5-10 nm, for example. In some of the embodiments described above, the alignment marks can be located on the outside of the wafer (near its edge) and these marks could be developed in order to properly position layers in multi-layer exposure experiments.

Exposure can be Accomplished by Following Devices:
Highly automated commercial production devices capable of high-throughput:
- Mask aligner with UV lamp source
  - Proximity, soft contact, hard contact, vacuum contact
  - 1 μm and larger feature sizes, typically
  - Smallest feature sizes obtained via contact methods
    - Creates problems: keeping mask clean
- UV-Stepper (laser or lamp source)
  - Either reduction (e.g. 5×) or not (e.g. 1×): i-line or g-line
  - 0.3 μm and larger features sizes, typically
  - Projection printing keeps mask pristine for unlimited exposures
- Deep UV-Stepper (laser source, typically)

Reduction (e.g. 5×) or 1:1 (e.g. 1×) exposure
Can use interference mask to achieve sub-100 nm feature sizes Non-commercial production devices potentially capable of high-throughput:
  X-ray Lithography (syncrotron source, special mask for x-rays)
    At shorter wavelengths (<100 nm), this achieves sub-100 nm feature sizes
    High beam intensity can be used for parallel exposure over a wide area Neutron Lithography (neutron reactor or spallation source, special mask that absorbs or scatters neutrons from spatially patterned regions)
    At shorter wavelengths (<100 nm), this achieves sub-100 nm feature sizes In the examples described above, a silicon wafer is typically used as the solid substrate. A silicon wafer is suitable for providing a flat substrate. In most of the examples we have shown, the exposure by radiation is directed from above the wafer directly toward the target structure without first encountering the wafer. This exposure from above is not a strict requirement. Using a polished quartz substrate, for example, it would be possible to perform the exposure through the substrate to the target structure, since quartz transmits UV light quite well.

Lower-throughput methods:
  Holographic laser tweezers
  Microscopic optical printing or continuous-flow lithography
    Electron beam lithography
    Direct-write laser technology
    Dip-pen nanolithography All of these methods could be used to create particles, albeit at much reduced rates compared to what one can achieve with the high-throughput methods.

The Internal Composition of the Particles can Contain Additives that Alter Specific Properties of the Particles:

These can take the form of deposited layers of a material and/or particles of that material that may be sandwiched between other layers of materials.

Optical properties:
  absorbing dyes
  fluorescing dyes
  phosphorescent materials
  fluorescing particles: quantum dots/rods/other shapes (eg. PbSe) scattering particles:
    gold or silver particles (enhanced Raman scattering)
    nanodroplets
    porous inorganic particles (silica)
  absorbing particles: iron oxide, carbon black, C60, carbon nanotubes, . . .
  optically anisotropic objects:
    birefringent materials (e.g. clays)
    chiral materials
  aligned optical axes: birefringent
  metallic layers or coatings to make them reflective
  refractive index modification: polymers and polymer blends:
    homopolymers
    di/multi-block polymers
    dendrimers and star polymers
  light-emitting polymers (stimulated electrically)

Magnetic properties:
  paramagnetic nanoparticles or microparticles (e.g. iron oxide nanoparticles)
  ferromagnetic nanoparticles or microparticles (e.g. Ni rods)
  spatially specific placement of nanoparticles within particles
  alternatively, a paramagnetic or ferromagnetic layer can be placed in the particles
  magnetically detectable "bar-codes" by placing magnetic domains in particles alignment and relative spacing of domains Electrical properties:
  silver, gold, platinum nanoparticles (e.g. to make the particles conductive)
  carbon fullerenes (i.e. buckyballs) and nanotubes
  indium tin oxide: transparent conductor
  conducting layers can be placed in the particles: spatially anisotropic conductivity
  insulating properties: oxide layers
  semiconducting properties: inorganics, doped inorganics
  conductive polymers (polyaniline)
  superconducting materials (high-Tc and ordinary)

Mechanical properties:
  carbon fullerenes (i.e. buckyballs) and nanotubes
  plasticizers: make flexible particles
  tackifiers: make sticky particles
  crosslinkers: increase mechanical rigidity
  semi-flexible polymers: rod-like polymers
  nanocomposites: increase strength (clays, silica)
  internal structures of particles altered by phase behavior: diblock copolymers
  UV-degradable polymers
  biodegradable polymers
  dendrimers Radioactive properties:
  isotopic substitution with radioactive components in layers
  radioactive nanoparticles can be added to polymer layers Isotopic properties
  Use isotopes in layers or particles embedded in layers
    odd-numbered nuclei for NMR enhancement/sensitivity Biocompatibility properties:
  use inert biocompatible polymers (e.g. silicone based systems)
  encapsulate incompatible materials (e.g. quantum dots inside particles)
  PEG, protein, biogels, RNA, or DNA coatings Porosity properties:
  use porous materials or tenuous polymer gels in layers
  metal-organic framework (MOF) materials (layers or particles)
  polymer-copolymer phases
  lyotropic liquid crystalline phases
  dip-coated particle layers
  inorganically templated surfactants or co-polymers Thermal properties:
  temperature sensitive polymers (poly-NIPAM): particles expand and contract
  melt the polymer exterior to smooth surfaces of particles
  control polymer glass transition temperature to make the particle amorphous
  thermally-reactive components inside of the particles (e.g. raise temperature and reactions occur within the particle)

Wettability properties:
  use fluorinated or partially fluorinated polymer layers or coatings to reduce surface energy
  use hydrophilic/hydrophobic siloxane coatings Solubility properties
  Swell crosslinked particles by putting them in a good solvent
  May remain stable at low pH, but dissolve or degrade at high pH
Catalytic properties:
  Metal catalysts such as Pt can be deposited in layers
  Can be embedded in porous substrates as particles
  Biological catalysts placed in particles
LithoParticle Surfaces can be Coated with:
Biomolecules
  (e.g. polypeptides, biotin, streptavidin, antibodies, antigens, lipids, sugars, membrane proteins, viral capsid proteins, DNA, RNA, . . . )
Poly-ethyleneglycol (PEG)
Charge groups
Polymer brushes
Nanoparticles
Polymers
Lipids
Surfactants
Photo-reactive groups
Metals
Siloxanes for controlling wetting and solvent compatibility
These coatings can be
  physically deposited (e.g. CVD)
  chemically reacted onto surface groups on the particles (e.g. bonded)
  adsorbed onto the surface (e.g. physiadsorption)
Many kinds of bio-molecules and other groups are derivatized, meaning that there is a reactive part of the molecule that has been attached in order to enable the molecule to bind to the particle's surfaces.
Suspending Liquid:
Polar Liquids (e.g. water)
  may contain ionic species
Non-polar Liquids (e.g. many hydrocarbon solvents)
The suspending liquid and surface properties of the particles determine whether or not the particles will remain stably suspended or if they will aggregate together. Factors that affect this are:
  pH
  ionic strength of any ions present
  aromatic/aliphatic nature of hydrocarbon solvents
  presence of polymers, surfactants, micelles, nanoparticles or other suspended material other than the particles in the liquid.
The density and refractive index of the liquid can be matched to that of the particles to provide for enhanced imaging using fluorescence confocal microscopy.
Some refractive index contrast between the suspending liquid and the particles is generally useful so that non-fluorescence microscopy techniques can be used to identify the particles.
The suspending liquid can potentially swell polymer particles. If this is not desired, then it is important to choose a liquid that does not swell the particles. Swollen particles could be useful for some purposes.
The suspending liquid can potentially react with the material of which the particles are comprised, so concentrating and washing the particles several times with pure suspending liquid is usually necessary to: (1) remove chemicals in the liquid developer solution for the resist or sacrificial layer (if present) and (2) remove the components of the sacrificial layer that have dissolved into the liquid. This leaves just a suspension of particles in a liquid that has only trace amounts of impurities of developer and sacrificial layer.

Solvent exchange procedures published in the literature can be used to change the solvent from polar to non-polar (e.g. aqueous to non-aqueous) in post-processing steps. Polymer particles in non-polar solvents can generally be simultaneously density matched and index matched.
Although more exotic, the suspending liquid could be liquified gases that are quite cold.
Classes of Geometries of Custom-Designed Shapes of Lithographic Particles
The following are examples of classes of shapes that can be made using the methods and processes described herein. This list, including the main categories, is not exhaustive, and generally only a limited number of examples are given.
Polyhedral prisms ("slabs" with two flat and parallel faces) both regular and irregular:
  Cross-section parallel to flat faces are n-sided regular and irregular polygons: e.g. triangles, squares, pentagons, hexagons, heptagons, octagons, . . . right rectangular prisms (rods and platelets)
  a variety of angles can be used (e.g. 30 deg, 60 deg, 90 deg, 120 deg, . . . )
Characters:
  All letters and portions of all letters of an alphabet (all languages and fonts)
  All numbers (both roman, latin, and other number systems)
  All punctuation marks
Symbols:
  Mathematical
  Logical
  Technical drawing: pointers, arrows, . . .
Labeling and Identifying Patterns:
  Microscopic bar codes (e.g. patterned lines or dots on surfaces of particles)
Toroids (particles with one or more holes):
  Circular donuts
  Square donuts
  Figure 8, letter B
  one can vary the number and placement of holes
Curved prisms (slabs with curved edges):
  Disks
  Elliptical slabs
  C-shapes, S-shapes, U-shapes
Prisms with curved and straight-edges:
  D-shapes, pie-shaped wedges, . . .
Particles with arms:
  variable number, length, width, thickness of arms gears (round shapes with projections), wheels (circles with internal spokes)
  E-shapes, combs
  crosses (3-arm, 4-arm, 5-arm, . . . )
Shapes appropriate for linking particles into assemblies:
  Dovetail shapes
  Lock-and-key (i.e. head-tail), chiral shapes (e.g. screws and screw-in lids)
Multi-layer particles containing variations of any shapes above
Types of Substrates:
  The examples have typically described using flat substrates, but this does not have to be the case in all embodiments of the invention. A substrate could be rough at a length scale much larger than the particle size, and the approach would still work reasonably well as long as projection exposures are used. Alternatively, a desirable texture in the substrate could be transferred to the particles through the single layer method. For the two-layer method, the roughness in the surface could be reduced by spin coating a thick sacrificial layer on top. Substrates can include: polished solids (e.g.

silicon wafers, quartz, etc.), rough solids that have a reasonably flat surface to allow uniform exposure. Their thicknesses and sizes can vary widely, although particular exposure equipment, such as steppers, generally require polished wafers of a certain diameter and thickness. The substrate can be reused according to embodiments of the current invention. Disposable substrates could also be used according to other embodiments of the current invention.

Methods of Depositing Materials:

Spin-coating
   An important fact is that the layer can be thicker at the edge ("edge-bead")
   Many spin-coating systems can be equipped with edge-bead removal mechanisms
   Therefore, most exposure systems are adjusted so that they don't expose the edge
Sputtering
Chemical Vapor Deposition (CVD)
Electron Beam Metal Deposition (EBMD)
Ion Implantation and Bombardment
Molecular Beam Epitaxy (MBE)
Dip-coating
Spray-coating
Electrospraying
Electroplating
All of these methods have different capabilities in terms of range of materials, thicknesses of the layers, convenience of use, economics.

Methods of Removing Materials:

These processes can be used to remove materials.
Developing
   Developers are usually liquid based solutions that are applied to exposed resist
   The developer removes (dissolves) the uncrosslinked regions of the resist
   Can be in either aqueous solvent or organic solvent
Dissolving
   Acidic and basic solutions can be used
   Good solvents for uncrosslinked polymers (e.g. Omnicoat) dissolve layers
Stripping
   Removes all hydrocarbons and other residues to clean wafer surfaces
   Can be used to remove resist layers that have been used for etching
Reactive Ion Etching/Plasma Etching
   A reactive plasma interacts with exposed surfaces and destroys them
   Works well generally with inorganics, some organics can be etched this way
   A variety of ionic species can be used in the plasma. Common ones are $O_2$, $SF_6$
Wet Etching
   A reactive solution etches away material (e.g. metals)
Ablation
   A high-powered laser beam blasts away material from the surface
Evaporation
   Baking processes usually remove the solvent bases through evaporation
Thermal degradation
   Organic materials can be ashed (turned to carbon) by raising the temperature Types of Sacrificial Layers:

Organic layers: uncrosslinked monomers or polymers
Inorganic layers
Inorganic oxide or nitride layers
Metal layers
More exotic layers could be imagined, but are not the simplest materials e.g. Metal-organic frameworks Methods of Aligning for Multiple Exposures:

To properly align wafers with respect to the mask for printing multiple exposures, it is usually necessary to include alignment marks on the wafer surface. These marks are specified by the manufacturer for a particular exposure device, and the software of the device knows how to recognize and locate these special marks. Optical equipment and feedback piezo control enable the mask and wafer to be aligned to within about 10 nm on a commercial stepper. Interferometric alignment systems can potentially align to 1 nm or less with proper thermal and mechanical stabilization.

For processes described in which successive exposures are carried out and need to be aligned, it may be necessary to place alignment marks toward the edge of the wafer, outside of the area where the particles are printed. These alignment marks can be selectively developed without developing the entire wafer. They can also be masked during deposition steps (e.g. by depositing a blocking layer). This can make the complex processes that involve creating overhanging features in multi-layer particles feasible.

If one chooses, the center of one mask can be offset to an arbitrary degree with regard to the alignment marks on the wafer, thereby providing a means of using the same masks but producing different particle shapes by offsetting (moving in position) the center locations of the array of patterns that are to be exposed in a second step. It is not necessary and it can even be undesirable for this offsetting to occur during exposure. Likewise, the patterned mask could be tilted relative to the wafer surface to create a different projection of the mask pattern onto the target structure, thereby substantially altering the resulting shapes of the non-contiguous structures after development.

Post Lift-Off Steps:

Cleaning
   Material from the sacrificial layer will usually be present in the lift-off solution. Development agents and resist components can also be present. In most cases one seeks to arrest any further chemistry that may occur as a result of these components, so it is generally necessary to concentrate the particles recovered without causing irreversible aggregation, and to remove the solution with these extra components, and dilute the particles with a pure solvent. This cleaning process or "washing" reduces non-particulate impurities in the solution that might degrade the particles or cause problems with other chemical steps afterwards.
Solvent Exchange
   Solvent exchange can be done to change the density or refractive index
   Dialysis is one method to achieve this
   Sedimentation, removal of the suspending liquid, and addition of a different liquid
Surface Modification
   To stabilize the particles against aggregation, it is sometimes necessary to perform chemical reactions of molecules onto the surface that provide a repulsive interaction between particles if they approach one another. This can be a very important step in making homogeneous suspensions in which the particles remain dispersed and "shelf-stable" over long periods of time.
   The type of surface modification that can be done generally depends on the solvent to be used and on the material composition of the particles. It is difficult to provide a totally general method that will assure stability for all compositions.

Existing methods are known in the literature for stabilizing the surfaces of metal, polymer, and inorganic particles.

The surface modification can be made before or after lift-off to modify either the exposed faces of particles or the entire particle's surfaces, respectively.

Concentrating Particles

Particles can be concentrated by applying an osmotic pressure to remove solvent

Common ways of doing this are dialysis, settling, and centrifugation

Causing reversible aggregation can also be a way of concentrating particles

Diluting Particles

Reducing the particle volume fraction can generally be accomplished by diluting

Mass Assembly of Complex Shapes in Solution:

Types of Attractions:

Depletion attraction (induced by adding inert polymer, nanoparticles, or micelles)

Van der Waals attraction

Bio-labeling of reactive sites (e.g. streptavidin-biotin)

Colloidosome process (amphiphilic particles on a surface)

Dense cluster process (swell, emulsify into a droplets of good solvent, Ostwald ripen to remove the liquid)

Vary sequence of addition of components, their shapes, and types of bonding sites.

The invention claimed is:

1. A method of producing particles, comprising:
providing a substrate structure comprising a solid substrate;
forming a target structure on said substrate structure, said target structure comprising first and second layers of radiation-reactive material with a layer of radiation non-reactive material therebetween;
forming a spatially patterned beam of radiation using a patterned mask;
exposing at least a portion of each of said first and second layers of radiation reactive material of said target structure to said spatially patterned beam of radiation to which said radiation-reactive material reacts while leaving other portions of said target structure unexposed to said spatially patterned beam of radiation;
removing substantially all of one of the exposed or the unexposed patterned portions of each of said first and second layers of radiation reactive material of said target structure to provide a plurality of non-contiguous structures in each of said first and second layers of radiation reactive material that include at least a portion of said radiation-reactive material;
separating the plurality of non-contiguous structures comprising said radiation-reactive material from each of said first and second layers of radiation reactive material of said substrate structure into a fluid material within which said non-contiguous structures form a dispersion after said separation; and
modifying at least a portion of a surface of each of said particles with a material having a predetermined chemical property,
wherein said layer of radiation non-reactive material is sufficiently transparent to said spatially patterned beam of radiation such that an underlying one of said first and second layers of radiation reactive material becomes exposed,
wherein each said non-contiguous structure of said radiation-reactive material provides at least a portion of a separate particle after said separation, and
wherein said modifying said particles comprises stabilization of said particles against aggregation.

2. A method of producing particles according to claim 1, wherein at least one of said first and second layers of radiation reactive materials has a maximum predetermined spatial dimension of thickness between about one nanometer and about ten microns.

3. A method of producing particles according to claim 1, wherein said patterned mask comprises one of positive or negative shadow patterns that consist essentially of a plurality of pre-designed representations of the desired cross-sections of said plurality of non-contiguous structures,
wherein said representations have dimensions that are one of equal to or larger than said non-contiguous structures.

4. A method of producing particles according to claim 1, wherein said spatially patterned beam of radiation is substantially uniform in intensity within each patterned region, and
wherein said intensity is above a threshold necessary to cause said radiation-reactive material to react.

5. A method of producing particles according to claim 1, further comprising a thermal processing of said radiation-reactive material subsequent to said exposure.

6. A method of producing particles according to claim 1, wherein said removing substantially all of one of the exposed or unexposed patterned portions of the target structure comprises using a liquid developer solution appropriate for said radiation-reactive material.

7. A method of producing particles according to claim 6, wherein said substrate structure comprises a sacrificial layer of radiation-non-reactive material formed on said solid substrate,
wherein said liquid developer solution leaves said sacrificial layer intact during said removing substantially all of one of the exposed or unexposed patterned portions of the target structure, and
wherein said separating the plurality of non-contiguous structures from the substrate structure includes dissolving said sacrificial layer with a solution that is different from said liquid developer solution.

8. A method of producing particles according to claim 1, further comprising a deposition of at least one of a metallic material, an inorganic material, an organic material, a magnetic material, a particulate material or a composite material prior to said separating the plurality of non-contiguous structures.

9. A method of producing particles according to claim 1, wherein said solid substrate structure comprises at least one of a low surface-energy surface or a low surface-energy surface coating to facilitate said separating the plurality of non-contiguous structures.

10. A method of producing particles according to claim 1, wherein said separating the plurality of non-contiguous structures comprises at least one of a mechanical agitation, a temperature change or a fluid flow to cause said plurality of non-contiguous structures to separate from said substrate.

11. A method of producing particles according to claim 1, wherein a maximum predetermined spatial dimension of each of said non-contiguous structures is less than about ten micrometers and more than about one nanometer.

12. A method of producing particles according to claim 1, wherein the plurality of non-contiguous structures of the radiation-reactive material includes at least 1,000 non-contiguous structures.

13. A method of producing particles according to claim 1, wherein said plurality of non-contiguous structures occupy an area that is at least 20% to about 90% of the entire area of said target structure.

14. A method of producing particles according to claim 1, wherein the radiation to which the radiation-reactive material is reactive comprises electromagnetic radiation.

15. A method of producing particles according to claim 1, wherein said radiation to which said radiation-reactive material is reactive comprises at least one of charged particles or neutral particles.

16. A method of producing particles according to claim 1, wherein said substrate structure comprises a sacrificial layer of radiation-non-reactive material formed on said solid substrate, and
wherein said separating the plurality of non-contiguous structures from the substrate structure includes dissolving said sacrificial layer.

17. A method of producing particles according to claim 1, wherein said substrate structure comprises a sacrificial layer of radiation-non-reactive material formed on said solid substrate, and
wherein said separating the plurality of non-contiguous structures from said substrate includes changing a temperature of said sacrificial layer.

18. A method of producing particles according to claim 1, wherein said separating the plurality of non-contiguous structures from said substrate structure is substantially concurrent with said removing one of either the exposed or the unexposed regions of said target structure.

19. A method of producing particles according to claim 1, wherein said substrate structure comprises a sacrificial layer of radiation-non-reactive material formed on said solid substrate, and
wherein said separating the plurality of non-contiguous structures from said substrate structure through said removal of the sacrificial layer is performed subsequent to said removing one of either the exposed or the unexposed regions of said target structure.

20. A method of producing particles according to claim 1, wherein said target structure comprises a plurality of layers of radiation-non-reactive material, each disposed between two layers of radiation-reactive material of said plurality of layers of radiation-reactive material.

21. A method of producing particles according to claim 1, wherein said exposure using said patterned mask comprises a plurality of sub-beams of spatially patterned radiation that provide said exposure over substantially an entire area of said target structure.

22. A method of producing particles according to claim 1, wherein said beam of spatially patterned radiation comprises at least one of substantially energetically monochromatic radiation or substantially energetically polychromatic radiation.

23. A method of producing particles according to claim 1, wherein said target structure comprises a plurality of nanoparticles in a composition thereof.

24. A method of producing particles according to claim 1, wherein said target structure comprises fluorescent molecules in a composition thereof.

25. A method of producing particles according to claim 1, wherein said target structure comprises molecules that cause a biological response in a composition thereof.

26. A method of producing particles according to claim 1, wherein said particles comprise a material in a composition thereof that modifies at least one of an optical property, a magnetic property, an electrical property, a mechanical property, a radioactive property, a nuclear isotopic composition, a biocompatibility property, a biodegradability property, a porosity property, a thermal property, a wetting property, a surface roughness property, a solubility property and a catalytic property of said particles.

27. A method of producing particles according to claim 1, further comprising adding at least one of an additive selected from the group of additives consisting of an acidic material, a basic material, an electrolyte material, an ionic material, a polar material, a non-polar material, a buffer, a surfactant, a lipid, a resin, a polymer, a block copolymer, a star polymer, a dendrimer, a wax, an oil, a juice, an extract, a flavor, a perfume, an aqueous solution, a biomolecule, a biopolymer, a microparticle, a nanoparticle, a droplet, a bubble, a foam, a dye, an ink, a paint, a fluorescent molecule, a pigment, a viscosity modifier, a stabilizer, a refractive index modifier, a thermal modifier, a surface energy modifier, a wetting modifier, a plasticizer, a swelling agent, a shrinking agent, a sol, a gel, a glass, an ion exchange resin, a nanoemulsion, a microemulsion, a thermotropic liquid crystal, a lyotropic liquid crystal, a plasticizer, a clay, a bonding agent, an adhesion promoter, a liposome, a vesicle, a micelle, a graphene material, a fullerene material, a nanotube, a nanosheet, a nanowire, a nucleic acid, a ribonucleic acid, a single-stranded deoxyribonucleic acid, a double-stranded deoxyribonucleic acid, an amino acid, a protein, an albumin, a collagen, a cellulose, a serum, an enzyme, an antibody, an antigen, an algenate, a biological cell, a biological tissue, a polypeptide, a copolypeptide, a vitamin, a biomolecular motor, a biomolecular assembly, a virus, a vault, a saccharide, a polysaccharide, a catalyst, an oligomeric molecule, a crosslinker molecule, an initiator, a quantum dot and a nutrient to said fluid material along with said particles.

28. A method of producing particles according to claim 1, further comprising forming a surface coating over at least a portion of a surface of said particles after said separating the plurality of non-contiguous structures of said radiation-reactive material from said substrate structure into said fluid material.

29. A method of producing particles according to claim 28, wherein said surface coating comprises a material selected from the group of materials consisting of a surfactant, an anionic surfactant, a cationic surfactant, a zwitterionic surfactant, a non-ionic surfactant, a polymeric surfactant, a lipopolymer, a lipid, a lipid bilayer, a lamellar vesicle, a multi-lamellar vesicle, a polymer, a derviatized polymer, a homopolymer, a copolymer, a block copolymer, a random copolymer, a polymer brush, a polymer coil, a polymer tether, a star polymer, a dendrimer, a polyacid, a polybase, a polyelectrolyte, a semiflexible polymer, a flexible polymer, a polyethylene glycol, a polysaccharide, a polyhydroxystearic acid, a polyvinylalcohol, a polysiloxane, a charge group, a sulfate group, a sulfonate group, a carboxylate group, an amine group, an acidic group, a basic group, a biomolecule, a biopolymer, a derivatized biopolymer, an antibody, an antigen, a peptide, a polypeptide, a copolypeptide, an amino acid, a protein, a membrane protein, a transcription protein, a structural protein, a viral protein, a snare protein, an actin, a tubulin, an enzyme, a vitamin, a biological cell wall, an albumin, a collagen, a cellulose, a cholesterol, a biomolecular motor, a kinesin, a saccharide, a polysaccharide, a liposaccharide, a biotin, an avidin, a streptavidin, a nucleic acid, a ribonucleic acid, a deoxyribonucleic acid, a derivatized deoxyribonucleic acid, an oligomeric nucleic acid, an oligomeric single-stranded deoxyribonucleic acid, an oligomeric double-stranded deoxyribonucleic acid, a biomolecular assembly, a biomotor, an acidic material, a basic material, a metallic material, an inorganic material, an organic material, a polar material, a non-polar material, a particulate material, a microparticle, a nanoparticle, a droplet, a microdroplet, a nanodroplet, a chemically reactive material, a thermally reactive material, a photoreactive material, a photoabsorbing material, a catalytic material, an isotopic material, a radioactive material, a thiolated molecule, an alkane, a silane, and a siloxane.

30. A method of producing particles according to claim 1, further comprising adding at least one of an inert polymer, nanoparticles or micelles to cause assembly between said particles by depletion attraction.

31. A method of producing particles, comprising:
  providing a substrate structure comprising a solid substrate;
  forming a target structure on said substrate structure, said target structure comprising a radiation-reactive material;
  forming a spatially patterned beam of radiation using a patterned mask;
  exposing at least a portion of said target structure to said spatially patterned beam of radiation to which said radiation-reactive material reacts while leaving other portions of said target structure unexposed to said spatially patterned beam of radiation;
  removing substantially all of one of the exposed or the unexposed patterned portions of said target structure to provide a plurality of non-contiguous structures that include at least a portion of said radiation-reactive material;
  separating the plurality of non-contiguous structures comprising said radiation-reactive material from said substrate structure into a fluid material; and
  prior to said separating the plurality of non-contiguous structures:
    depositing a second target structure comprising a radiation-reactive material on the first-mentioned target structure after said exposing at least a portion of the first-mentioned target structure to said spatially patterned beam of radiation;
    forming a second spatially patterned beam of radiation using a patterned mask so that it is in a substantially predetermined aligned position relative to said exposed portion of the first-mentioned target structure;
    exposing at least a portion of said second target structure to said second spatially patterned beam of radiation while leaving other portions of said second target structure unexposed to said second spatially patterned beam of radiation; and
    removing substantially all of one of the exposed or the unexposed patterned portions of the second target structure to provide said plurality of non-contiguous structures,
  wherein each said non-contiguous structure of said radiation-reactive material provides at least a portion of a separate particle after said separation.

32. A method of producing particles according to claim 31, wherein said radiation-reactive material in said second target structure is substantially attached to said radiation-reactive material in said first target structure to provide said plurality of non-contiguous structures.

33. A method of producing particles according to claim 31, wherein said second beam of spatially patterned radiation is formed using a second patterned mask that is different from said first beam of spatially patterned radiation using the first-mentioned patterned mask.

* * * * *

UNITED STATES PATENT AND TRADEMARK OFFICE
CERTIFICATE OF CORRECTION

| | | |
|---|---|---|
| PATENT NO. | : 8,617,798 B2 | Page 1 of 1 |
| APPLICATION NO. | : 12/377773 | |
| DATED | : December 31, 2013 | |
| INVENTOR(S) | : Mason et al. | |

It is certified that error appears in the above-identified patent and that said Letters Patent is hereby corrected as shown below:

In the Specification:

At column 1, line numbers 9 – 10 should read:

This invention was made with Government support ~~of~~ <u>under</u> Grant No. ~~CHE-~~0450022, awarded by the National Science Foundation. <u>The Government has certain rights in this invention.</u>

Signed and Sealed this
Third Day of June, 2014

Michelle K. Lee
*Deputy Director of the United States Patent and Trademark Office*